(12) United States Patent
Nizam

(10) Patent No.: US 11,429,768 B2
(45) Date of Patent: Aug. 30, 2022

(54) REGISTER TRANSFER LEVEL (RTL) IMAGE RECOGNITION

(71) Applicant: Synopsys, Inc., Mountain View, CA (US)

(72) Inventor: Zamrath Nizam, Colombo (LK)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/930,173

(22) Filed: Jul. 15, 2020

(65) Prior Publication Data
US 2021/0019461 A1    Jan. 21, 2021

(30) Foreign Application Priority Data

Jul. 18, 2019 (IN) .............................. 201911029029

(51) Int. Cl.
*G06F 30/327* (2020.01)
*G06F 30/33* (2020.01)

(52) U.S. Cl.
CPC ............ *G06F 30/327* (2020.01); *G06F 30/33* (2020.01)

(58) Field of Classification Search
CPC ....... G06F 30/33; G06F 30/327; G06F 30/337
USPC ........................................................ 716/106
See application file for complete search history.

(56) References Cited

U.S. PATENT DOCUMENTS

| 6,836,877 | B1 * | 12/2004 | Dupenloup | G06F 30/30 |
| | | | | 716/103 |
| 2009/0307640 | A1 * | 12/2009 | Chapman | G06F 30/398 |
| | | | | 716/136 |
| 2015/0161313 | A1 * | 6/2015 | Drasny | G06F 30/30 |
| | | | | 716/103 |
| 2018/0181683 | A1 * | 6/2018 | Armoni | G06F 30/327 |

OTHER PUBLICATIONS

Rieger et al., "Visual Detection of Duplicated Code," Lecture Notes in Computer Science, Sep. 1998, pp. 1-6.
Winter et al., "Sextant: A Tool to Specify and Visualize Software Metrics for Java Source-Code," 4th International Workshop on Emerging Trends in Software Metrics (WETSoM), IEEE May 2013, pp. 49-55.

(Continued)

*Primary Examiner* — Paul Dinh
(74) *Attorney, Agent, or Firm* — Haynes Beffel & Wolfeld LLP; Andrew Dunlap

(57) ABSTRACT

A method of generating images from Register Transfer Level (RTL) code for clone detection or code verification is provided. The method includes obtaining a first RTL code, extracting first RTL constructs from the first RTL code, generating a first array from the extracted first RTL constructs, generating a first RTL image representation (RIR) image from the generated first array, wherein color in the first RIR image corresponds to values included in the first array, comparing the generated first RIR image to other RIR images to find a portion of an RIR image that matches at least a portion of the generated first RIR image, and determining that the portion of the first RTL code is validated as (Continued)

a result of finding the portion of the RIR image that matches the portion of the generated first RIR images.

**19 Claims, 19 Drawing Sheets
(9 of 19 Drawing Sheet(s) Filed in Color)**

(56) References Cited

OTHER PUBLICATIONS

Nataraj, S. Karthikeyan et al., "Malware Images: Visualization and Automatic Classification," IEEE Symposium on Visualization for CyberSecurity, Jul. 20, 2011, 7 pages.

Kamiya, et al., CCFinder: "A Multilinguistic Token-Based Code Clone Detection System for Large Scale Source Code", IEEE Transactions on Software Engineering; 2002, pp. 654-670.

Falke, et al., "Clone Detection Using Abstract Syntax Suffix Trees", International Conference on Software Maintenance, Nov. 20, 1998, 11 pages.

B. Baker "A Program for Identifying Duplicated Code", Proceedings of Computing Science and Statistics: 24th Symposium on the Interface, vol. 24:4957, 24:49-57, 1992.

Tech Design Forum, Lint, https://www.techdesignforums.com/practice/guides/lint-rtl/, retrieved on Dec. 4, 2020, 2 pages.

Ducasse et al., "A Language Independent Approach for Detecting Duplicated Code," Proceedings of the 15th International Conference on Software Maintenance; ICSM 1999, pp. 109-118.

Roy et al., "Comparison and Evaluation of Code Clone Detection Techniques and Tools: A Qualitative Approach," Science of Computer Programming, Feb. 24, 2009, 26 pages.

Baxter et al., "Clone Detection Using Abstract Syntax Trees," Proceedings of the 14th International Conference on Software Maintenance ICSM 1998, pp. 368-377.

Tomáš Bublik, et al., "Scripting Language for Java Source Code Recognition", International Conference on Future Information Engineering, pp. 119-130, 2014.

White et al., "Deep Learning Code Fragments for Code Clone Detection," 31st IEEE/ACM International Conference on Automated Software Engineering (ASE) Sep. 3-7, 2016, pp. 87-98.

Miens et al., "A Survey of Software Refactoring," IEEE Transactions on Software Engineering, vol. 30, No. 2, Feb. 2004, pp. 126-139.

Zeng et al., "Architecture Refinements by Code Refactoring of Behavioral VHOL-AMS Models," 2006 IEEE International Symposium on Circuits and Systems, May 21-24, 2006, pp. 1475-1478.

Sheneamer et al., "Semantic Clone Detection Using Machine Learning," 15th IEEE International Conference on Machine Learning and Applications ICMLA, Dec. 18-20, 2016, pp. 1024-1028.

Abebe, Mesfin et al., "Trends, Opportunities and Challenges of Software Refactoring: A Systematic Literature Review", International Journal of Software Engineering and Its Application, vol. 8, No. 6, pp. 299-318, 2014.

Maggio, Valerio, "Unsupervised Machine Learning for Clone detection", https://www.slideshare.net/valeriomaggio/unsupervised-machine-learning-for-clone-detection. Slide 69, Jun. 25, 2013, retrieved on Mar. 22, 2021, 1 page.

Payne, Daniel, "RTL Design Restructuring Explained", https://semiwiki.com/semiconductor/defacto-technologies/6202-rtl-design-restructuring-explained, Sep. 22, 2016, retrieved on Mar. 22, 2021, 6 pages.

Haynal, Steve, Intel, "Refactoring to Prepare RTL for Reuse", https://www.design-reuse.com/articles/20119/refactoring-rtl-reuse.html, retrieved on Mar. 22, 2021, 5 pages.

Venderlip, Jeff, "Physical RTL optimization solved problems early", https://www.eetimes.com/document.asp?doc_id=1206380#, Feb. 15, 2011, retrieved on Mar. 22, 2021, 8 pages.

Orgeston, "Kirk with an upside down face", https://drawception.com/panel/drawing/wK836336/kirk-with-an-upside-down-face-not-nose, Sep. 14, 2014, retrieved on Mar. 22, 2021, 1 page.

Wikipedia, "Canonical form", https://en.m.wikipedia.org/wiki/Canonical_form, May 22, 2019, retrieved on Mar. 22, 2021, 8 pages.

Synopsys Inc., CAPA-ML, 1 page.

\* cited by examiner

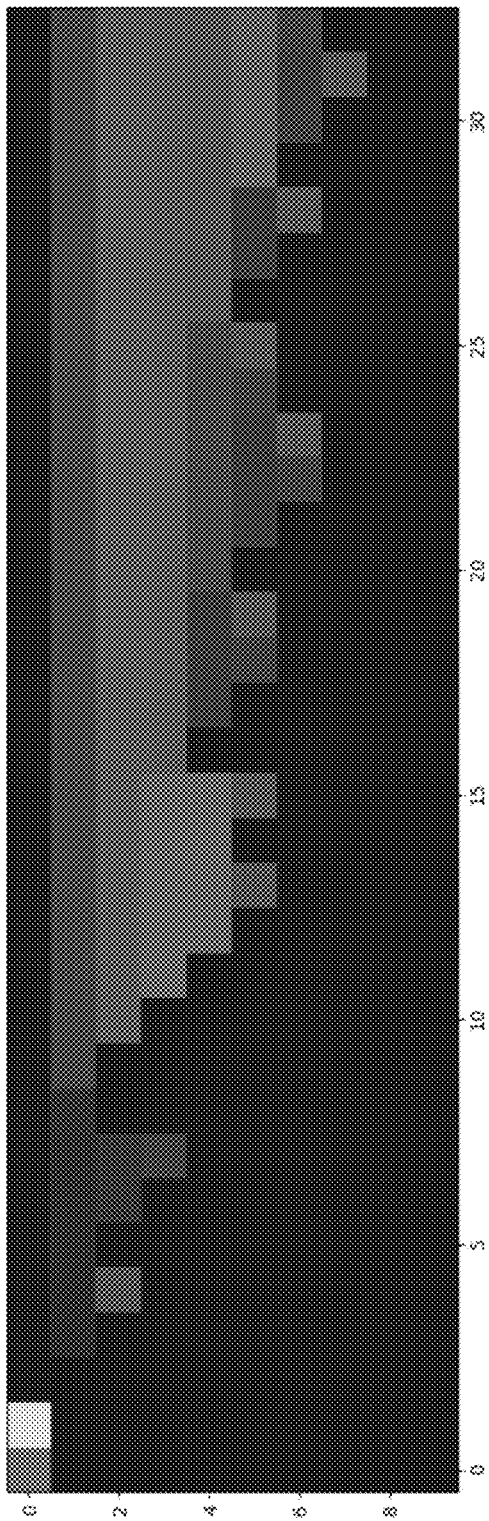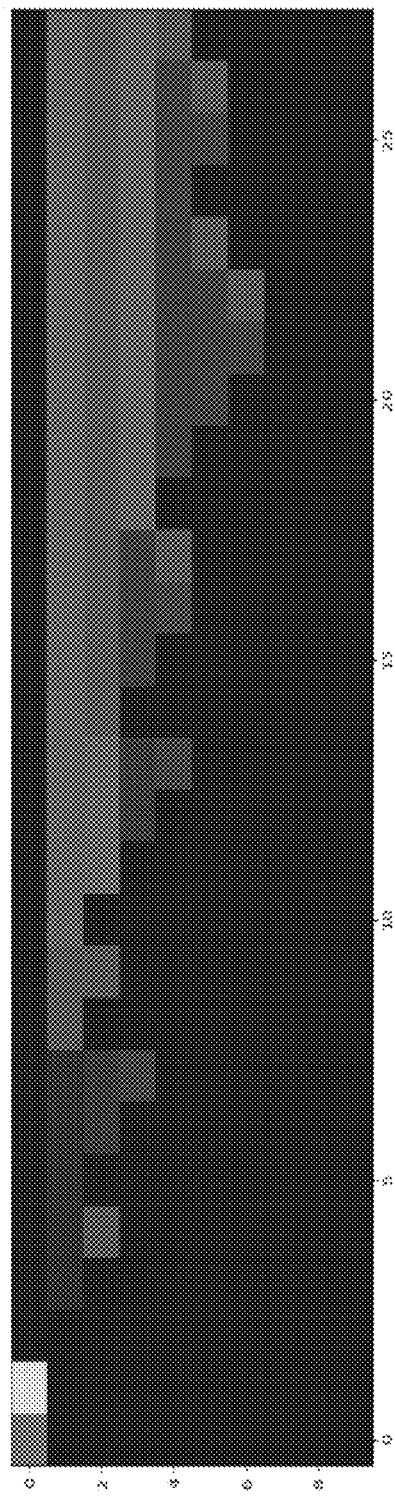
FIG. 3A
FIG. 3B

FIG. 6

| 602 | | | | | | 604 | | | | | | 118 |
|---|---|---|---|---|---|---|---|---|---|---|---|---|
| 69 | 72 | 0 | 0 | 0 | 0 | 0 | 0 | 0 | 0 | 0 | | 0 |
| 69 | 0 | 0 | 0 | 0 | 0 | 0 | 0 | 0 | 0 | 0 | | 0 |
| 4 | 48 | 97 | 68 | 0 | 0 | 4 | 48 | 97 | 68 | 0 | 0 | 1 |
| 4 | 48 | 97 | 0 | 0 | 0 | 4 | 48 | 97 | 0 | 0 | 0 | 1 |
| 4 | 48 | 105 | 0 | 0 | 0 | 4 | 48 | 105 | 0 | 0 | 0 | 1 |
| 4 | 48 | 17 | 0 | 0 | 0 | 0 | 0 | 0 | 0 | 0 | | 0 |
| 4 | 48 | 0 | 0 | 0 | 0 | 4 | 48 | 0 | 0 | 0 | 0 | 1 |
| 4 | 17 | 0 | 0 | 0 | 0 | 4 | 17 | 0 | 0 | 0 | 0 | 1 |
| 4 | 0 | 0 | 0 | 0 | 0 | 4 | 0 | 0 | 0 | 0 | 0 | 1 |

```
Module W323_m1(i1, i2, io1, ck, o1);
  input i1, i2, ck;
  inout io1;
  output o1;
  reg o1;

always@ (posedge ck);
    o1 <=#5 i1 assign io1 = i2;
endmodule
```

```
################################################################################
#>>> Construct order (default: 'r'):                                            #
#    Specify the order in which you are searching a pattern ('e': exact order and 'r': relative order).#
#    E.g. If you specify 'e', construct patterns like 'module,always' will not output testcases in #
#         'module,generate,always' pattern. For this you may specify 'r'.       #
#>>> Construct(s):                                                              #
#    Specify the verilog constructs you need to search for (e.g. 'modport' or 'interface,function'). #
#    NOTE: Should be a comma separated list (for constructs more than one).     #
#          Should be in the order you are intending to search for.              #
#    E.g. modport                                                               #
#         interface,function                                                    #
#         module,always,if,block_assign                                         #
#>>> Different combinations ('y' to print) (default: 'n'):                      #
#    If you specify 'y', this will print all combinations of rtl constructs in specified pattern. #
#    NOTE: This will output only one pattern from one testcase.                 #
#>>> Run again ('y' to continue) (default: 'n'):                                #
#    If you need to explore more patterns, you may continue.                    #
################################################################################
        >>> Construct order (default: 'r'): e
        >>> Construct(s): concat 394 testcases found
        Showing only first 5 results. If you want all the testcases, please specify '-all'
            <5 testcases are displayed>
        >>> Different combinations ('y' to print) (default: 'n'): y 116 patterns found
        Showing only first 5 results. If you want all the patterns, please specify '-all'
            1:
        module,always,delay_or_event,seq_block,if,non_block_assign,binary,concat,basednumber
            2: module,always,delay_or_event,seq_block,case,concat,bitselect,namedobjectuse
            3: module,always,delay_or_event,if,seq_block,block_assign,concat,basednumber
            4: module,always,delay_or_event,seq_block,case,concat,namedobjectuse
            5: module,contassign,condop,concat,namedobjectuse
        >>> Run again ('y' to continue) (default: 'n'): y >>> Construct order (default: 'r'):
        >>> Construct(s): port,bitselect 2 testcases found
            <2 testcases are displayed>
        >>> Different combinations ('y' to print) (default: 'n'): y 1 pattern found
            1: module,port,bitselect,namedobjectuse
        >>> Run again ('y' to continue) (default: 'n'): n
```

FIG. 9

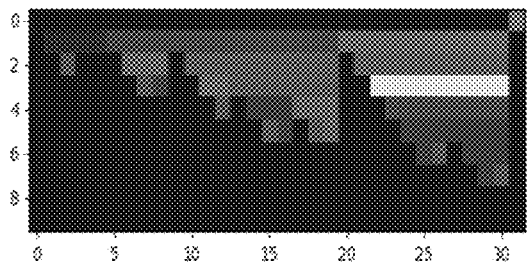
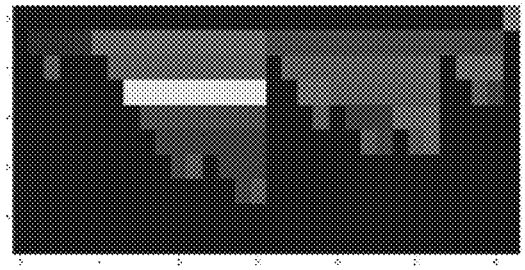
FIG. 11A
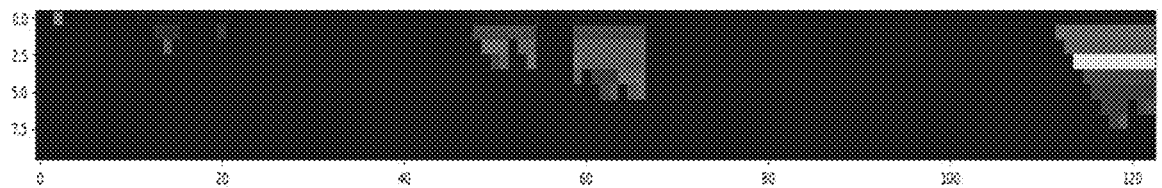
FIG. 11B
FIG. 11C

REGISTER TRANSFER LEVEL (RTL) IMAGE RECOGNITION

PRIORITY APPLICATION

This application claims the benefit of IN Provisional Patent Application No. 201911029029, filed 18 Jul. 2019.

TECHNICAL FIELD

The present disclosure relates to Register Transfer Level (RTL) image recognition (RIR). More specifically, the present disclosure relates to generating images or vectors from RTL code and utilizing various applications such as data mining, and code clone detection.

BACKGROUND

Code clone detection is a way to recognize possible reusable code fragments and apply proper software practices. For example, duplicate code fragments can be identified in code that has already been verified or used in product. The duplicate code fragments that have already been verified will not need to be re-verified for production, even if used in a different context. Further, clone code detection can be used to identify which portions of code have changed between different versions of software, and allow software designers to focus in on verifying other parts of the code that are new to a particular version. Clone code detection can also be used to identify related test cases when a designer is searching for a particular solution.

BRIEF SUMMARY OF THE DISCLOSURE

According to an aspect of the technology disclosed a method of generating images from Register Transfer Level (RTL) code for clone detection or code verification is provided. The method can include obtaining a first RTL code, extracting first RTL constructs from the first RTL code, generating a first array from the extracted first RTL constructs, and generating a first RTL image recognition (RIR) image from the generated first array. The color in the first RIR image corresponds to values included in the first array. The method can further include comparing the generated first RIR image to other RIR images to find a portion of an RIR image that matches at least a portion of the generated first RIR image, and determining that the portion of the first RTL code is validated as a result of finding the portion of the RIR image that matches the portion of the generated first RIR image.

According to another aspect of the technology disclosed, the method further includes identifying a first object path of interest from the first RTL constructs. Further, the method can includes the generating of the first array comprises generating the first array, for the first object path of interest, by (i) identifying, from an index list, first indexes associated with the first RTL constructs, (ii) assigning a value to each identified index of the first indexes associated with the first RTL constructs, the values assigned to the identified first indexes being determined in dependence upon corresponding depths of the first RTL constructs in the first object path of interest, and (iii) populating the array with the identified first indexes and the values assigned to the first indexes, such that the first array has a particular value assigned to each identified index of the first indexes.

Further another aspect of the technology disclosed includes sorting the values in the first array based on non-zero values assigned to the first indexes to obtain a first index array.

In one aspect of the technology disclosed, the method further includes generating a first skeletal view table using the first index array. Further, each row in the first skeletal view table can correspond to a different depth of the first object path of interest. Additionally, values of cells in each row of the first skeletal view table can correspond to the index or indexes associated with corresponding first RTL constructs implemented at each different depth. Each cell in the first skeletal view table that does not have a value that corresponds to an index of the first indexes is assigned a value of 0. The method can further include transposing the first skeletal view table. Further, the first RIR image is generated from the transposed first skeletal view table. Each value in the first skeletal view table can represent a color in each corresponding pixel in the first RIR image.

According to an aspect of the technology disclosed, duplicate columns with in the transposed first skeletal view table are discarded before the first RIR image is generated from the transposed first skeletal view table.

In another aspect of the technology disclosed the first skeletal view table is of m-by-n dimensions. "m" can be an integer that defines a number of rows and m is equal to a number of depths identified in the first object path of interest. "n" can be an integer that defines a number of columns. According to another aspect of the technology disclosed, n is predefined by user input RTL code.

In another aspect, the method further includes generating a base RTL map by aggregating the first RIR image and a second RIR image generated using an obtained second RTL code. Further, duplicate columns between the first and second RIR images can be excluded from being included in the base RTL map.

In one aspect of the technology disclosed the method of claim further includes respectively normalizing the base RTL map against the first and second RIR images by identifying columns from the base RTL map that match the respective first and second RIR image, to generate first and second normalized RIR images, and performing a type-3 or a type-4 comparison between the first and second normalized RIR images and the other RIR images to identify cloned or verified RTL codes.

Additionally, in another aspect of the technology disclosed, the method includes generating a first canonical RIR vector for the first normalized RIR image by comparing each column of the transposed first skeletal view table to each column of the base RTL map and assigning a value in a corresponding position in the first canonical RIR vector in dependence on whether a column from the transposed first skeletal view table matches a column of the base RTL map, generating a second canonical RIR vector for the second normalized RIR image by comparing each column of a transposed second skeletal view table to each column of the base RTL map and assigning a value in a corresponding position in the second canonical RIR vector in dependence on whether a column from the transposed second skeletal view table matches a column of the base RTL map, and performing the type-3 or type-4 comparison by comparing the first canonical RIR vector and the second canonical RIR vector to other canonical RIR vectors representing the other RIR images.

Moreover, according to an aspect of the technology disclosed, a non-transitory computer readable storage medium comprising stored instructions to generate images from Register Transfer Level (RTL) code for clone detection or code verification is provided. The instructions, which when executed on a processor, cause the processor to perform operations including obtaining a first RTL code, extracting first RTL constructs from the first RTL code, generating a first array from the extracted first RTL constructs, generating a first RTL image recognition (RIR) image from the generated first array. Color in the first RIR image can correspond to values included in the first array, comparing the generated first RIR image to other RIR images to find a portion of an RIR image that matches at least a portion of the generated first RIR image, and determining that the portion of the first RTL code is validated as a result of finding the portion of the RIR image that matches the portion of the generated first RIR image.

In an aspect of the technology disclosed, the operations further include generating a first skeletal view table using a first index array. Further, each row in the first skeletal view table corresponds to a different depth of a first object path of interest identified from the first RTL constructs. Additionally, values of cells in each row of the first skeletal view table correspond to an index or indexes associated with corresponding first RTL constructs implemented at each different depth. Each cell in the first skeletal view table that does not have a value that corresponds to an index of first indexes is assigned a value of 0. Further, the operations can include transposing the first skeletal view table. Further, the first RIR image is generated from the transposed first skeletal view table. Each value in the first skeletal view table represents a color in each corresponding pixel in the first RIR image.

In another aspect of the technology disclosed the operations can further include generating a base RTL map by aggregating the first RIR image and a second RIR image generated using an obtained second RTL code.

In a further aspect of the technology disclosed duplicate columns between the first and second RIR images are excluded from being included in the base RTL map.

Additionally, in an aspect of the technology disclosed, the operations further includes respectively normalizing the base RTL map against the first and second RIR images by identifying columns from the base RTL map that match the respective first and second RIR image, to generate first and second normalized RIR images, and performing a type-3 or a type-4 comparison between the first and second normalized RIR images and the other RIR images to identify cloned or verified RTL codes.

In another aspect of the technology disclosed, the operations can include generating a first skeletal view table using a first index array. Further, each row in the first skeletal view table corresponds to a different depth of a first object path of interest identified from the first RTL constructs. Moreover, values of cells in each row of the first skeletal view table correspond to an index or indexes associated with corresponding first RTL constructs implemented at each different depth. Each cell in the first skeletal view table that does not have a value that corresponds to an index of first indexes is assigned a value of 0. The operations can further include transposing the first skeletal view table. The first RIR image can be is generated from the transposed first skeletal view table. Each value in the first skeletal view table represents a color in each corresponding pixel in the first RIR image. The operations can further include generating a first canonical RIR vector for the first normalized RIR image by comparing each column of the first transposed skeletal view table to each column of the base RTL map and assigning a value in a corresponding position in the first canonical RIR vector in dependence on whether a column from the first transposed skeletal view table matches a column of the base RTL map, generating a second canonical RIR vector for the second normalized RIR image by comparing each column of a transposed second skeletal view table to each column of the base RTL map and assigning a value in a corresponding position in the second canonical RIR vector in dependence on whether a column from the transposed second skeletal view table matches a column of the base RTL map, and performing the type-3 or type-4 comparison by comparing the first canonical RIR vector and the second canonical RIR vector to other canonical RIR vectors representing the other RIR images.

In a further aspect of the technology disclosed a system is provided. The system can include a memory storing instructions to generate images from Register Transfer Level (RTL) code for clone detection or code verification, and a processor, coupled with the memory and to execute the instructions. The instructions when executed cause the processor to obtain a first RTL code, extract first RTL constructs from the first RTL code, generate a first array from the extracted first RTL constructs, generate a first RTL image recognition (RIR) image from the generated first array. The color in the first RIR image corresponds to values included in the first array, generate a first normalized RIR image using the first RIR image, generate a second normalized RIR image using a second RIR image, and compare the generated first and second normalized RIR images to other RIR images to identify cloned or verified RTL codes.

In another aspect of the technology disclosed the comparison of the first and second normalized RIR images to the other RIR images is a type-3 or a type-4 comparison.

In a further aspect of the technology disclosed, the instructions, when executed, further cause the processor to generate a first canonical RIR vector for the first normalized RIR image by comparing each column of the transposed first skeletal view table to each column of the base RTL map and assigning a value in a corresponding position in the first canonical RIR vector in dependence on whether a column from the transposed first skeletal view table matches a column of the base RTL map, generate a second canonical RIR vector for the second normalized RIR image by comparing each column of a transposed second skeletal view table to each column of the base RTL map and assigning a value in a corresponding position in the second canonical RIR vector in dependence on whether a column from the transposed second skeletal view table matches a column of the base RTL map, and perform the type-3 or type-4 comparison by comparing the first canonical RIR vector and the second canonical RIR vector to a repository of other canonical RIR vectors representing the other RIR images.

BRIEF DESCRIPTION OF THE DRAWINGS

The patent or application file contains at least one drawing executed in color. Copies of this patent or patent application publication with color drawing(s) will be provided by the Office upon request and payment of the necessary fee. The color drawings also may be available in PAIR via the Supplemental Content tab.

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 3A illustrates a first RIR image generated from a first example RTL code according to an embodiment of the technology disclosed.

FIG. 3B illustrates a second RIR image generated from a second example RTL code according to an embodiment of the technology disclosed.

FIG. 6 illustrates the generation of a first canonical RIR vector using an example base RTL map and the transposed skeletal view table of FIG. 2B according to an embodiment of the technology disclosed.

FIG. 9 illustrates a user providing specific constructs and identifying RTL code according to the provided constructs.

FIG. 11A illustrates similar RTL codes from two different RTL code blocks according to an embodiment of the technology disclosed.

FIG. 11B illustrates first and second RIR images generated from the two different RTL code blocks illustrated in FIG. 11A according to an embodiment of the technology disclosed.

FIG. 11C illustrates a normalized image of both of the first and second RIR images illustrated in FIG. 11B according to an embodiment of the technology disclosed.

DETAILED DESCRIPTION

Figure 1:
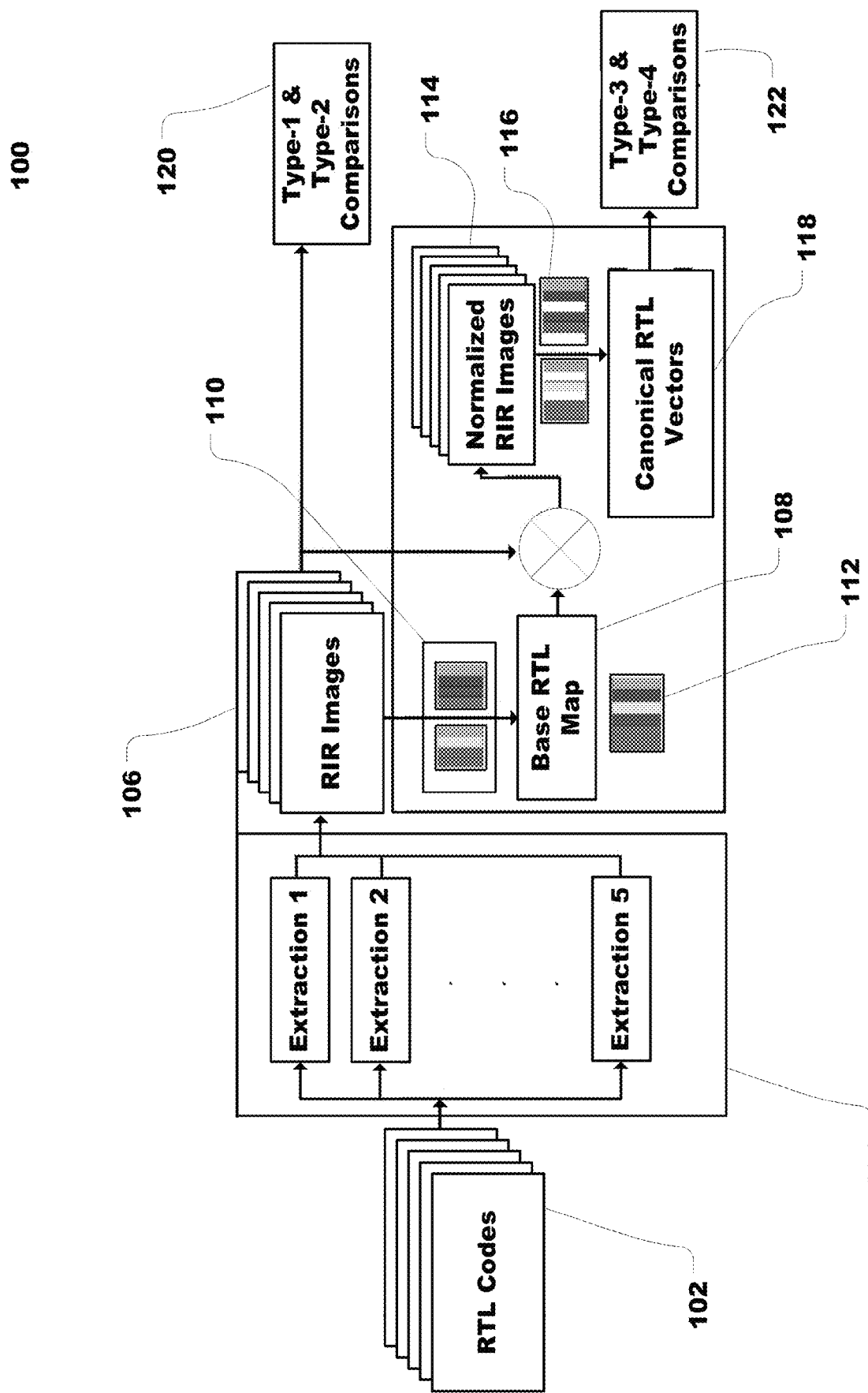
FIG. 1 illustrates a flowchart depicting the process of generating images from RTL code and then performing clone detection of various types, according to various embodiments of the technology disclosed.

Aspects of the present disclosure relate to Register Transfer Level (RTL) image recognition.

The technology disclosed generates images (and vectors) from RTL code (code which describes how data is transformed as it is passed from register to register). These images (and vectors) can be used for code clone detection, identifying similar code blocks in other source files of a code/data repository of RTL codes, data analytics, reuse of RTL code when necessary or appropriate, and detecting and applying constraints on similar code fragments. This can be achieved using RTL Image Recognition (RIR) and related methodologies described below.

Specifically, RIR is a robust technique to represent RTL codes in a pixel space (e.g., as an image) and/or as a vector, based on RTL constructs extracted from RTL codes. Advantages of the technology disclosed include, but are not limited to the ability to use RIR to check for early issues in the RTL code, before moving onto another stage of software verification, such as Lint analysis (Lint is a static analysis tool that does not execute RTL code, but instead examines the RTL code based on a set of rules). As mentioned above, this allows for RTL specific code clone detection techniques to be implemented.

Additionally, advantages of the technology disclosed include using a machine learning interface to analyze the images (or vectors) generated from the RTL codes. This machine learning can be used in RTL data driven initiatives such as noise reduction in EDA tool domains. Another advantage of the technology disclosed is that the hardware security domain can be explored using the images (or vectors) generated from the RTL codes. This RIR methodology implemented by the technology disclosed is described in further detail below. Moreover, implementation of the technology disclosed allows for code clone detection techniques and well as all other techniques described herein, to be performed using less computing resources (e.g., process utilization and storage resources) when compared to other conventional techniques.

However, before discussing the figures in detail, a framework is described. The framework includes various stages such as obtaining an 'Object Path,' generating a 'Skeletal View Table', uniquifying and getting a normalized RTL image (RIR image) and corresponding RTL vector. Generally, source code goes through steps such as Pre-processing, Transformation and Matching Detection. However, the technology disclosed does not need pre-processing to modify the RTL code. Instead, the RTL code itself will be subjected to the transformation. Hence, RTL code will go through transformation and matching detection. Matching Detection is dedicated for RTL code clone detections. Under transformation, extraction is performed by generating data vectors of each RTL construct using Object Path intuition and creating the Skeletal View from each data vector. Subsequently, normalization is performed as the vectors are first aggregated and then uniquified to form non-duplicate vectors to create RIR images of each RTL code set testcase. Next, all the RIR images are used to create a single 'Base RTL Map.' Using the Base RTL Map, corresponding normalized RIR images are generated. Using each of these images, a canonical RTL Vector can be generated for each RIR image. Under matching detection, the technology disclosed proposes two approaches such as exact matching and partial matching for code clone detection.

FIG. 1 illustrates a flowchart depicting the process of generating images from RTL code and then performing clone detection of various types, according to various embodiments of the technology disclosed.

Specifically, the flowchart 100 identifies operations performed by the technology disclosed and identifies different stages at which matching detection can be performed. For example, the technology disclosed can perform four different types of matching detections (type-1, type-2, type-3, and type-4). Type-1 identifies exact clones, meaning that to find a match there may be identical code fragments without whitespace or comments. Type-2 identifies "renamed" code fragments, meaning that to find a match the code fragments may be identical by syntax, except for variations in identifiers, literal (meaning values assigned to signals, the values can be numeric or string values) and types. Type-3 identifies "gapped clones," meaning that the code fragments may be identical with minor modifications, such as changed, added or removed statements. Type-4 identifies "semantic clones" that are identical by functionality with different syntax. The stages illustrated in FIG. 1 include (i) a transformation stage which includes extraction, obtaining a skeletal view matrix using an object path of interest and generation of RIR images, (ii) a normalization state, which includes generating a base RTL map, obtaining normalized RIR images and generating corresponding RTL (RIR) vectors in canonical form and (iii) the matching detection stage. These stages are described below with reference to FIG. 1, as well as additional figures.

Transformation Stage

This stage focuses on extracting RTL constructs and transforming the corresponding RTL codes into meaningful images (representations).

Extraction and Object Paths. The technology disclosed extracts RTL constructs or identifier types from RTL codes to create RTL objects and assigned a specific value to each. For example, SpyGlass® can be used to extract the RTL constructs from their respective scope locations. SpyGlass® uses an object model (OM), which describes a mechanism by which objects are handled in programming architecture, to represent RTL types. There are about 300 RTL objects defined in this example OM. In other words, there are about 300 index values, each being associated with a particular RTL construct. The indexes that correspond to the RTL constructs can be identified using an index list that, for example, identifies the 300 RTL objects mentioned above.

An example RTL code is provided below:

```
module m(in, clk, out);
  input in, clk;
  output reg out;
  always (@posedge clk) begin
    out <= in; // ←(A)
  end
endmodule
```

From this example "module m" (actually just "module") is a construct associated with the index value 4 from the example RTL code, "input in" and "output reg out" (actually referred to as "port") is a construct associated with the index value 17, the named object use is referred to as "out" is a construct associated with the index value 68, "always" is a construct associated with the index value 48, "@posedge clk" (actually just "posedge") is a construct associated with the index value 105, and "out<=in" is a construct associated with the index value 97. A person of ordinary skill in the art will recognize the various constructs included in the example RTL code and will understand the indexes associated therewith. These index values are only examples and other index value schemes can be implemented.

These constructs, which are extracted or identified from the RTL code, can be used along with their corresponding index values to generate a table or an array. As an example, Table A below illustrates the existence of each construct extracted from the RTL code. However, this is only an example and the object path might not include all of these objects at once. Table A merely represents an example to represent all of the constructs mentioned above.

TABLE A

| Index | 0 | 1 | ... | 4 | 5 | ... | 17 | ... | 48 | ... | 68 | ... | 97 | ... | 105 | ... | 298 | 299 |
|---|---|---|---|---|---|---|---|---|---|---|---|---|---|---|---|---|---|---|
| Value | 0 | 0 | ... | 1 | 0 | ... | 1 | ... | 1 | ... | 1 | ... | 1 | ... | 1 | ... | 0 | 0 |

As illustrated, there are 300 index values in Table 1, where a value of 1 is associated with each index for which a construct was identified or extracted from the RTL code and where a value of 0 is associated with each index for which there is no construct identified or extracted from the RTL.

From the example RTL code provided above, an object path of interest may be identified. The object path of interest represents the perspective from which a first (object path) array can be generated. In this example, the object path of interest will be from the perspective of the RTL code line marked as "(A)" which is essentially the output of the RTL code. This example object path of interest includes "module," "always," "out" and "out<=in". Other examples of different object paths of interest could include the path to the sensitivity list of the always block (i.e., "@posedge clk"). Once the object path of interest is determined, depths can be assigned to the various constructs in accordance to the scope of each construct starting from the Root of the RTL code to the end of the RTL code according to the identified object path. RTL codes (like most of the other programming languages) define the scope for each object to avoid object collisions (i.e., any object defined in a local scope (say within a function), only refers within the scope boundary (function boundary)). This is similarly applied for all the objects in the RTL code. Most of the compilers/synthesizers in the EDA domain use this scoping and can be used in the RIR technology, as understood by a person of ordinary skill in the art. For example, using the RTL code described above, root has a depth of 0, module has a depth of 1, always has a depth of 2 (as ports and the always block are just inside the module boundary), @posedge has a depth of 3 (as this is inside the always block), out<=in has a depth of 3 (again @posedge and out<=in are in the same scope, which is inside the always block), and out has a depth of 4 (as it is inside the out<=in scope).

Below Table B illustrates an index and a value associated with each construct, where the value of each construct is defined by its depth from the perspective of the object path of interest. Table B represents an example of the first (object path) array to the object "out".

TABLE B

| Construct | "module" | "port" | "always" | "out" | "out <= in" | "posedge" |
|---|---|---|---|---|---|---|
| Index | 4 | 17 | 48 | 68 | 97 | 105 |
| Value (depth) | 1 | 0 | 2 | 4 | 3 | 0 |

Turning back to the flowchart 100 of FIG. 1, several RTL codes 102 are illustrated. In an example that carries throughout this disclosure, there are 5 different RTL codes from which RIR images 106 are generated. As explained above, an extraction 104 of RTL constructs is performed for each RTL code.

Skeletal View Tables. Before the RIR images 106 can be generated, skeletal view tables may be generated for each of the RTL codes. In the example illustrated in FIG. 1, 5 skeletal view tables may be generated, one for each of the 5 RTL codes.

After generating the object path arrays, such as the first (object path) array described in Table B, for each of the RTL construct using the identified object path, the object path arrays are re-sequenced. Specifically, the indexes associated with the identified RTL constructs are reordered based on their depth values. This re-sequenced data can be referred to as an index array which is used to generate the skeletal view table. Using the first (object path) array from Table B, the non-zero values (indexes having non-zero depth values) are sorted to arrive at an index array including [4, 48, 97, 68]. A skeletal view table can then be generated from the index array.

Figure 2A:
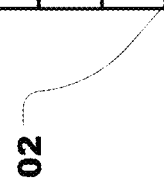
FIG. 2A illustrates an example skeletal view table generated from RTL code according to an embodiment of the technology disclosed.
Figure 2B:
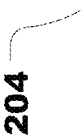
FIG. 2B illustrates a transposed skeletal view table obtained by transposing the example skeletal view table of FIG. 2A according to an embodiment of the technology disclosed.

FIG. 2A illustrates an example skeletal view table 202 generated from RTL code according to an embodiment of the technology disclosed, and FIG. 2B illustrates a transposed skeletal view table 204 obtained by transposed the example skeletal view table of FIG. 2A according to an embodiment of the technology disclosed.

Specifically, FIG. 2A illustrates a skeletal view table 202 generated from the index array including [4, 48, 97, 68]. Each row in the skeletal view table 202 represents a different depth level in the object path. At the first (non-zero) depth the module having an index of 4 is called. Therefore, the first row of the skeletal view table 202 has a value of 4 in the first column and 0's in the remaining columns. Similarly, at the second depth level the module having the index of 4 is called and the port 17 is called. Therefore, the second row of the skeletal view table 202 has a value of 4 in the first column, a value of 17 in the second column and 0's in the remaining columns. The skeletal view table 202 continues to be populated with values using this same methodology. The skeletal view table 202 is not limited to having the same number of rows and columns. The number of rows will be dictated by the number of lines and the number of depth levels in the object path (number of different depth patterns identified in the object path). The number of columns can be arbitrary and it could be long enough to contain the number of depth levels, or a user can increase or decrease the number of columns. Starting with 10 columns is usually sufficient. The higher the number of columns (and rows) the higher the post processing load. The skeletal view table 202 can be of m-by-n dimensions, where m is an integer that defines a number of rows and m can be equal to a number of different depth patterns identified in an object path of interest, and where n is an integer that defines the number of columns and n can be predefined by the user. Duplicate rows can be deleted, or they can be preserved. Preserving duplicate rows allows for type-1 and type-2 matching, which is described in more detail below.

Once the skeletal view table 202 is populated, it is transposed to form a transposed skeletal view table 204 as illustrated in FIG. 2B.

RIR Images. Referring to FIG. 1, the RIR images 106 are generated from data obtained by extracting the RTL constructs. This is done using the skeletal view table 204 generated from the RTL constructs. Specifically, each value in the transposed skeletal view table 204 can be considered as pixel value and thus complete table can now consider as a pixel matrix. Therefore, each pixel value in the transposed skeletal view table 204 can represent a particular color in an RIR image.

Figure 3C:
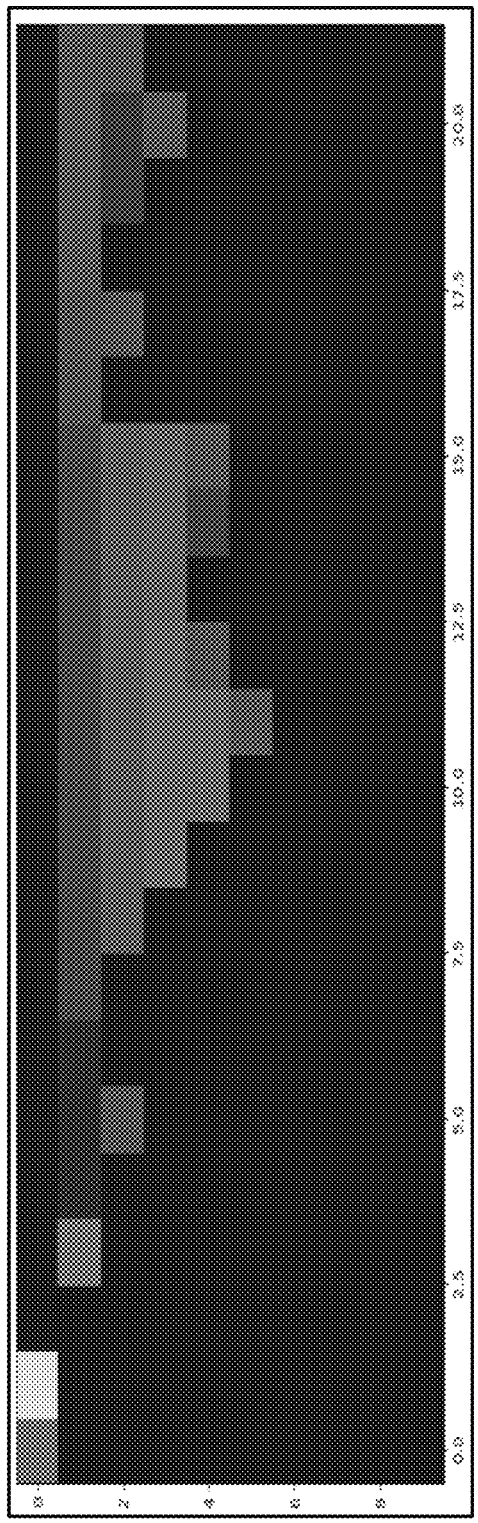
FIG. 3C illustrates a third RIR image generated from a third example RTL code according to an embodiment of the technology disclosed.
Figure 3D:
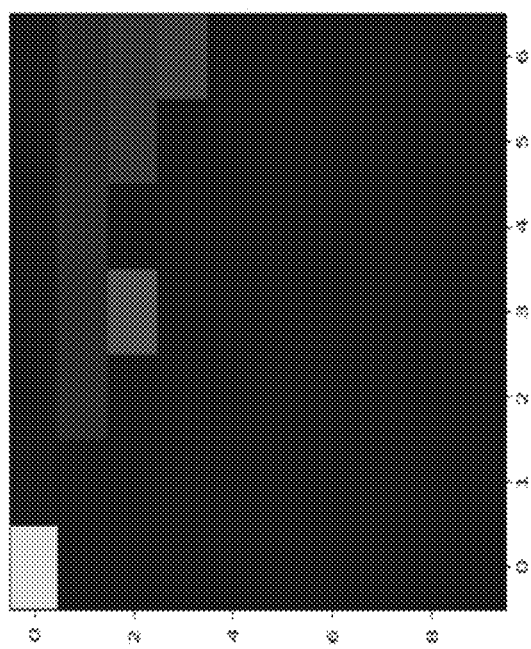
FIG. 3D illustrates a fourth RIR image generated from a fourth example RTL code according to an embodiment of the technology disclosed.
Figure 3E:
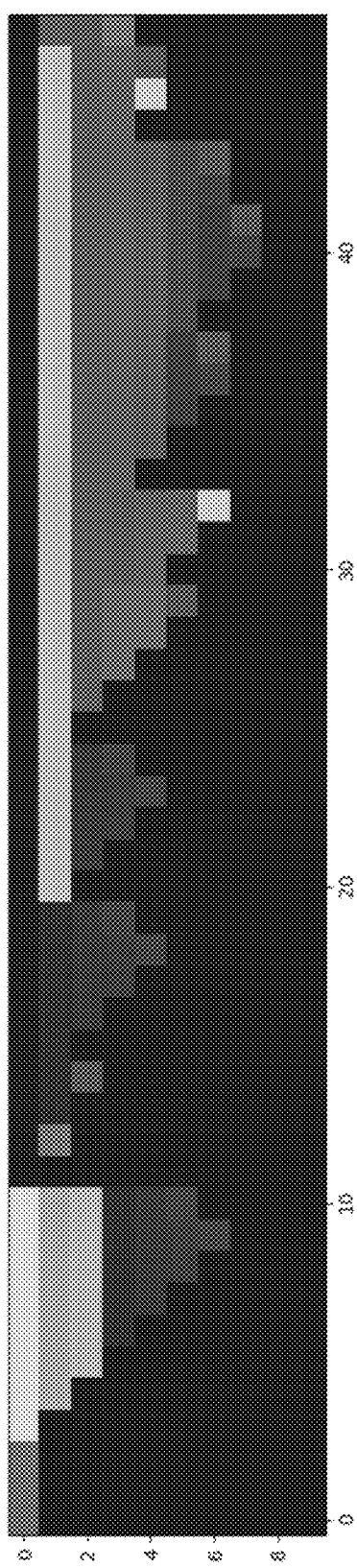
FIG. 3E illustrates a fifth RIR image generated from a fifth example RTL code according to an embodiment of the technology disclosed.

FIG. 3A illustrates a first RIR image generated from a first example RTL code according to an embodiment of the technology disclosed, FIG. 3B illustrates a second RIR image generated from a second example RTL code according to an embodiment of the technology disclosed, FIG. 3C illustrates a third RIR image generated from a third example RTL code according to an embodiment of the technology disclosed, FIG. 3D illustrates a fourth RIR image generated from a fourth example RTL code according to an embodiment of the technology disclosed and FIG. 3E illustrates a fifth RIR image generated from a fifth example RTL code according to an embodiment of the technology disclosed.

Specifically, the first through fifth RIR images of FIGS. 3A, 3B, 3C, 3D and 3E are generated by obtaining first through fifth inverted skeletal tables (not illustrated) from the RTL constructs extracted from the RTL codes 102 illustrated in FIG. 2. Each of the first through fifth RIR images respectively illustrated in FIGS. 3A, 3B, 3C, 3D and 3E is generated in the same manner as discussed above with respect to the skeletal view table 202 and the inverted skeletal view table 204 illustrated in FIG. 1. RIR images can be generated from any form of RTL code fragments including RTL blocks, RTL designs, Hierarchical RTL IPs, etc. irrespective of their size.

Normalization. Each of the first through fifth RIR images of FIGS. 3A, 3B, 3C, 3D and 3E is normalized by generating a base RTL map and then using the base RTL map to individually normalize each RIR image.

Normalization—Generation of the base RTL map. The base RTL map is generated by adding all the RIR images 106 together and excluding duplicate vectors. A simplified color band example 110 illustrates the results of combining all of the RIR images 106. The color band example 110 illustrates that the colors of the RIR images 106 are combined (one after another) to form multiple columns of color, where one or more of the colors comes from each of the RIR images 106. Accordingly, the RIR images 106 are combined to make one larger image. A more detailed example of combining the RIR images of FIGS. 3A-3E is discussed in more detail below with reference to FIG. 4. After the RIR images 106 of FIG. 1 are combined, the resulting image (e.g., the color band example 110) is normalized to form, for example, a normalized color band example 112. As illustrated, the color band example 110 includes all of the colors from the RIR images 106 and as illustrated, in the normalized color band example 112, some of the duplicate colors are removed as a result of normalizing the color band example 110. The result is the base RTL map 108.

Figure 4:
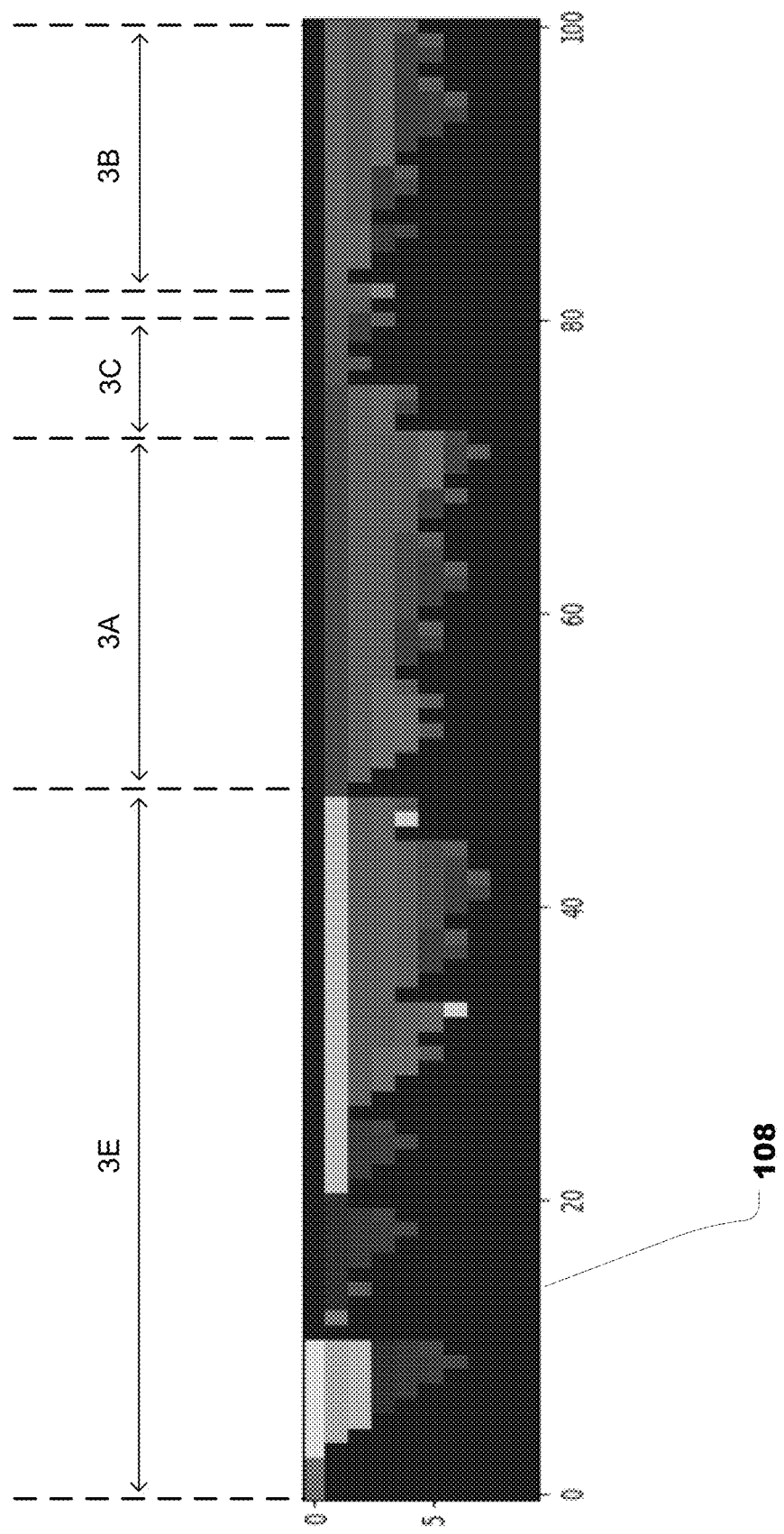
FIG. 4 illustrates a base RTL map generated from the first through fifth RIR images of FIGS. 3A, 3B, 3C, 3D and 3E according to an embodiment of the technology disclosed.

FIG. 4 illustrates a base RTL map 108 generated from the first through fifth RIR images of FIGS. 3A, 3B, 3C, 3D and 3E according to an embodiment of the technology disclosed. Specifically, as illustrated in FIG. 4, the base RTL map 108 includes portions of the RIR images of FIGS. 3A, 3B, 3C and 3E. Images from FIGS. 3A, 3B, 3C, 3D and 3E are present in the base RTL map 108, but not all of them will be contiguous (i.e., they will be scattered as the base RTL map is created by adding all the RTL images, sorting and removing the duplicates). Hence there will be overlapping RTL portions from different RIR images. Further, the base RTL map 108 is not necessarily distinguishable as scaled and presented with the annotations above the image representing the base RTL map 108. The features of different RIR images can overlap and this representation is only for the sake of understanding the concept.".

Normalization—Normalizing the RIR Images. As illustrated in FIG. 1, the base RTL map 108 is used to normalize the RIR images to generate 5 separate normalized RIR images 114. Each normalized RIR image corresponds to one of the RIR images 106. This normalization of each of the RIR images 106 is done by going column-by-column in each RIR image to identify a corresponding position/column in the base RTL map 108 to identify a match. This is done one-by-one (column-by-column) to identify corresponding positions in the base RTL map to construct the normalized RIR images 114. FIG. 1 provides a color band example 116 of a normalized image.

Figure 5A:
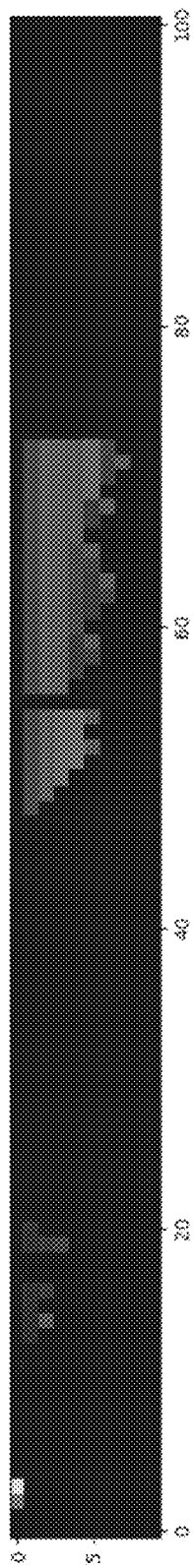
FIG. 5A illustrates a normalized version of the first RIR image generated by normalizing the first RIR image against the base RTL map according to an embodiment of the technology disclosed.
Figure 5B:
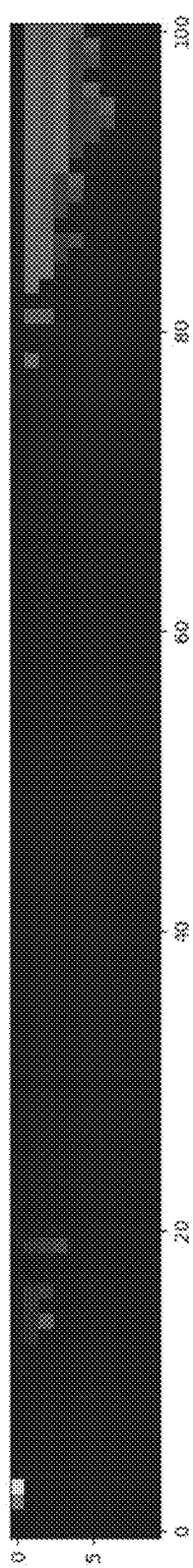
FIG. 5B illustrates a normalized version of the second RIR image generated by normalizing the second RIR image against the base RTL map according to an embodiment of the technology disclosed.
Figure 5C:
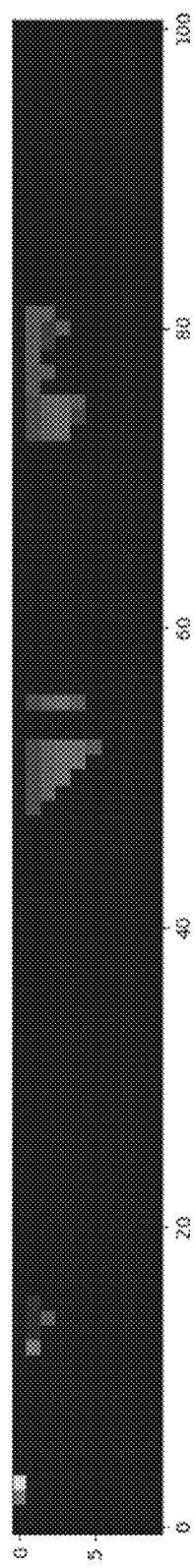
FIG. 5C illustrates a normalized version of the third RIR image generated by normalizing the third RIR image against the base RTL map according to an embodiment of the technology disclosed.
Figure 5D:
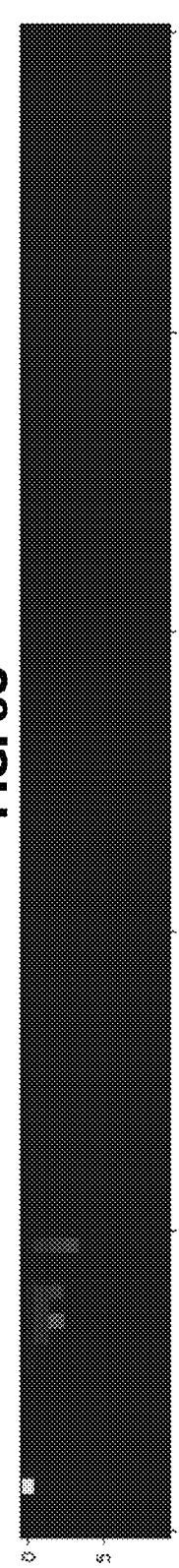
FIG. 5D illustrates a normalized version of the fourth RIR image generated by normalizing the fourth RIR image against the base RTL map according to an embodiment of the technology disclosed.
Figure 5E:
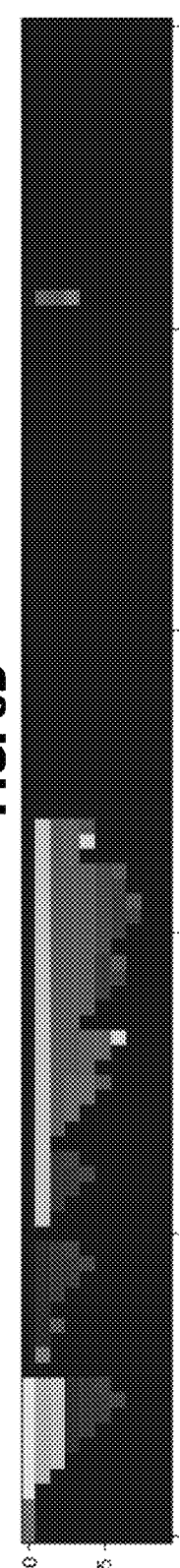
FIG. 5E illustrates a normalized version of the fifth RIR image generated by normalizing the fifth RIR image against the base RTL map according to an embodiment of the technology disclosed.

FIGS. 5A, 5B, 5C, 5D and 5E provide a more detailed example of normalizing the RIR images 106. Specifically, FIG. 5A illustrates a normalized version of the first RIR image generated by normalizing the first RIR image of FIG. 3A against the base RTL map of FIG. 4 according to an embodiment of the technology disclosed, FIG. 5B illustrates a normalized version of the second RIR image generated by normalizing the second RIR image of FIG. 3B against the base RTL map of FIG. 4 according to an embodiment of the technology disclosed, FIG. 5C illustrates a normalized version of the third RIR image generated by normalizing the third RIR image of FIG. 3C against the base RTL map of FIG. 4 according to an embodiment of the technology disclosed, FIG. 5D illustrates a normalized version of the fourth RIR image generated by normalizing the fourth RIR image of FIG. 3D against the base RTL map of FIG. 4 according to an embodiment of the technology disclosed, and FIG. 5E illustrates a normalized version of the fifth RIR image generated by normalizing the fifth RIR image of FIG. 3E against the base RTL map of FIG. 4 according to an embodiment of the technology disclosed.

Normalization—Generating Canonical RTL Vectors. The base RTL map 108 provides a feature set where each feature represents a unique and distinct skeletal view. This means any given construct pattern should be fit into one and only one position. Hence any non-void column(s) in the normalized RIR image 604 of FIG. 6 can be considered as '1' and any void column(s) in the same can be considered as '0'. This provides a vector which will be considered as the feature vector. Using the feature vector, RIR testcase vectors can be generated for each RTL testcase.

For example, referring to FIG. 6, which illustrates the generation of a first canonical RIR vector using an example base RTL map 602 and the transposed skeletal view table of FIG. 2B according to an embodiment of the technology disclosed.

Specifically, FIG. 6 illustrates an example base RTL map 602 that was generated using the transposed skeletal view table 204 along with other skeletal view tables generated from other RTL codes or designs. Each column of the transposed skeletal view table 204 of FIG. 2B is compared to the example base map 602. If a matching column is found between the transposed skeletal view table 204 of FIG. 2B and the example base RTL map 602, then a corresponding column is filled in on an intermediary table 604. If a column in the base RTL map 602 is not in the transposed skeletal view table 204 redundant, then the corresponding column in the intermediary table 604 is filled with zeros. Accordingly, the intermediary table 604 provides a normalized version of the transposed skeletal view table 204. As illustrated, the first three columns of the example RTL base map 602 match the first three columns of the transposed skeletal view table 204. Thus, the first three columns of the intermediary table include/match the first three columns of the example RTL base map 602. However, the fourth column of the example RTL base map 602 does not match any column of the transposed skeletal view table 204. Therefore, the fourth column of the intermediary table 604 includes all zeros. Next, the canonical RTL (RIR) vector 118 (see FIG. 1) is generated using the base RTL map (or a skeletal view representation thereof). Specifically, a location in the canonical RTL vector 118 has a value of 1 if a corresponding column in the intermediary table 604 does not have all zeros and a location in the canonical RTL vector 118 has a value of 0 if a corresponding column in the intermediary table 604 does have all zeros. The canonical RTL vector 118 represents the existence of each RIR Image column compared to the example base RTL map 602. This can be referred to as the RIR vector. The canonical RTL vector 118 can be compared to other canonical RIR vectors in a repository of RIR vectors that represent other RIR images. The canonical RTL vector 118 is compared to the other canonical RIR vectors for type-3 and type-4 comparisons, as discussed below in further detail.

The RIR vector can be considered as canonical form of RTL design as discussed in Wikipedia (https://en.m.wikipedia.org/wiki/Canonical_form) [Accessed: Jun. 11, 2019].

For an example, considering the RTL code below:

```
always (@posedge clk) begin
out[i+1] <= in; // ←(C)
end
```

Considering the signal 'out', signal 'in' is a sibling object while bit select object (i.e. [i+1]) is a child object. The table below shows how 'Object Paths' of sibling nodes/objects and children nodes/objects can be paired with the original 'Object Path'. There can be multiple siblings or children, where in that case, the resulting 'Object Paths' will be the aggregation of siblings' 'Object Paths' and children's 'Object Path' separately. The combined 'Object path' can be used to create the skeletal view and thereby the modified RIR image. The resulting RIR image will only include 1 or 0 where '1' represents the presence of RTL constructs while '0' otherwise. Subsequent operations will be the same as that illustrated in and discussed with respect to FIG. 1.

| 'Object Path' of intended node | 'Object Path' of sibling nodes | 'Object Path' of children nodes |
|---|---|---|
| 0 1 1 1 0 0 ... 0 | 1 0 0 0 1 0 ... 0 | 0 0 1 1 1 0 ... 0 |

Canonical property provides a very efficient representation even for large designs and helps easy RTL design equivalency check.

RIR Extensions. The technology disclosed has been explained in detail up to canonical representation, different intermediate formats can be used as per the requirement. The different types of matching are described above. Specifically, type-1 or original form of RIR images can be used in Image Processing related RTL applications, type-2 format can be used in isomorphic matching between two RTL codes, type-3 normalized format can be used to make different RTL codes comparable and finally type-4 canonical format makes Machine Learning techniques possible.

The 'Object Path' for each construct/object in the RTL is the basic building block of the RIR methodology. However, due to the complex nature of RIR applications, sometimes this information might not be enough. Accordingly, RIR extensions can be used as follows.

RIR Extensions—Associated Nodes. There can be associated RTL objects which can be used to describe an intended RTL object. For example, an RTL construct can have sibling constructs which are in the same scope of this construct as well as children constructs which reside under the scope of this construct.

RIR Extensions—RTL Characteristics. Additional RTL features can be used to describe the intended RTL object. This is done by evaluating this RTL object for its characteristics such as base type, connectivity, implicit details, etc. Below are some example RTL features.

| Feature Type | Features |
|---|---|
| Module | Is this a cell defined/macro/library module |
| | Is the top module |
| | Is synthesizable |
| | Is a nested module |
| Net | Is a port net |
| | If a port net, does it have explicit direction |
| | Is the net implicit |
| | Is a vectored net |
| | Is a constant declaration |
| Function | Is function return is constant |
| | Is function recursive |
| | Is function return is automatic |
| Instance | Is instance not named |
| | Is dot start port connection exists |
| Global | Is a System Verilog construct |

Hence, this data can be represented as an additional feature set to the RIR data.

| 'Object Path' of intended node | 'Object Path' of sibling nodes |
|---|---|
| 0 1 1 1 0 0 ... 0 | 0 1 1 1 0 0 ... 1 |

| 'Object Path' of children nodes | RTL features |
|---|---|
| 1 0 0 1 0 1 ... 0 | 1 1 0 0 1 0 ... 1 |

RIR Extensions—Object Naming. Type-1 matching is needed with each object is correctly differentiated, in addition to their respective RTL line, the naming of each object should be preserved along with their respective RTL data.

For an example, to compare two sensitivity lists where ordering can be different, their naming should be preserved.

TABLE

Matching RTL object naming

| Sensitivity list from RTL 1 | Sensitivity list from RTL 2 | Comments |
|---|---|---|
| always (sig1, sig2, sig3) | always (sig1, sig2, sig3) | Matching as all the signals are present. |
| always (sig1, sig2, sig3) | always (sig2, sig1, sig3) | Matching as all the signals are present even the order is changed |
| always (sig1, sig2, sig3) | always (sig1, sig3) | Not matching as the signal 'sig2' is not present in the RTL 2. |
| always (sig1, sig2, sig3) | always (sig1, sig3, sig4) | Not matching as the signal 'sig2' is not present in the RTL 2 even an additional signal 'sig4' is introduced |

For these types of matchings, an extra feature set in needed to include their naming. Therefore, categorical or textural data unlike all the previous numerical data is needed. Basic label encoding or one-hot encoding or some advanced encoding to convert these categorical features to numerical features can be used.

This extra feature set can be added as an extension to the other features as below.

| 'Object Paths' of intended and/or associated nodes | | | | | | | RTL features | | | | | | | Naming features | | | | | | |
|---|---|---|---|---|---|---|---|---|---|---|---|---|---|---|---|---|---|---|---|---|---|
| 0 | 1 | 1 | 1 | 0 | 0 | ... | 0 | 1 | 1 | 0 | 0 | 1 | 0 | ... | 1 | 1 | 0 | 0 | 0 | 0 | 0 | ... | 0 |

This type of format can be used to observe difference between two corresponding RTL such as UPF generated codes in two different runs. This is a direct application in VC LP™ tool of Synopsys®.

RIR Extensions—Constraints. RTL designers set various types of constraints such as Synopsys Design Constraint (SDC), Unified Power Format (UPF), etc. in different stages of design cycle. These constraints are set on the design objects present in the RTL designs.

These constraints applied on RTL design objects are as important as other RTL features that can be extracted to differentiate RTL objects in the design. Hence it is important to dump this constraint information also along with RIR data.

Below is a list of design objects which can be used as command arguments to SDC constraints as specified in www.vlsi-expert.com/2011/02/synopsys-design-constraints-sdc-basics.html (accessed Jun. 28, 2020). There are more SDC command arguments than what has been presented in the below table.

TABLE

Example constraint commands

| Design Objects | Commands | Description |
|---|---|---|
| Port | get_ports | An entry or exit point of a design |
| | all_inputs | All entry points |
| | all_outputs | All exit points |

TABLE-continued

Example constraint commands

| Design Objects | Commands | Description |
|---|---|---|
| Pin | get_pins | Instance or cell pin |
| Net | get_nets | Connection between cell pin and port |
| Register | all_registers | A sequential element |

Example usage of an SDC constraint is given below can be found at www.ece.ubc.ca/~edc/7660.jan2018/lec9.pdf (accessed Jun. 28, 2020).

set_input_delay clock clk-max 8 [get_ports port1]

As these constraints are applied on each RTL design objects, the data can be extracted as additional features to describe these objects. Below is an example table of features that can be extracted with respect to RTL objects as given in www.vlsi-expert.com/2011/02/synopsys-design-constraints-sdc-basics.html (accessed Jun. 28, 2020).

TABLE

Example constraint features

| Main features | Sub features |
|---|---|
| System interface | set_drive |
| | set_driving_cell |
| | set_fanout_load |
| | set_input_transition |
| | set_load |
| Design rule constraints | set_max_capacitance |
| | set_max_fanout |
| | set_max_transition |
| | set_min_capacitance |
| Timing exceptions | set_false_path |
| | set_max_delay |
| | set_min_delay |

Similarly, the features from UPF or any other constraint attribute can be defined or any other constraint attributes to meaningfully define RTL objects present in the RTL code. This can be used to increase the overall precision in our data analytics usages.

Hence, this extra feature set can be added as an extension to the other features as below.

| 'Object Paths' of intended and/or associated nodes and/or RTL features | Naming features | Constraint features |
|---|---|---|
| 0 1 1 1 0 0 ... 0 | 0 0 0 0 0 1 0 ... 0 | 0 0 1 1 1 0 ... 0 |

Applications of RIR Image Generation

RIR vectorization (or RTL vectorization), as described above, can be used to characterize a hypothesis of a machine learning model. A RIR vector of each normalized RIR image can be considered as training data (xi for ith testcase). Each of these training data will have the RTL design path as the label (yi for ith testcase). Below is the prototype implementation coded in python to extract the RTL (RIR) vector when given the RIR images.

```
def get_normalized_rtl_vector(base_image, base_rtl_map, rtl_image):
    rtl_image_mod = np.zeros((base_image.shape[0]))
    for row in rtl_image:
        str_row = ''
        for j in range(len(row)):
            str_row + = str(row[j]) + ','
        base_id = base_rtl_map[str_row]
        rtl_image_mod[base_id] = 1
    return rtl_image_mod
for rtl_code_path in rtl_code_rir_datasets:
    rtl_code_rir_dataframe = rtl_code_rir_datasets[rtl_code_path]
    rtl_image = rtl_code_rir_dataframe.values
    normalized_rtl_image = get_normalized_rtl_vector(base_image, base_rtl_map, rtl_image)
    normalized_rtl_image_dataset[rtl_code_path] = normalized_rtl_image
```

'rtl_code_rir_datasets' is a dictionary container where each key represents the design path and each value represents the corresponding RIR image. Each RIR image is passed to 'get_normalized_rtl_vector' to produce the RIR vector (xi) and will be assigned to the same testcase (yi) in another dictionary container ('normalized_rtl_image_dataset').

Any supervised or unsupervised estimation model can be trained using these training dataset {x1, y1}, {x2, y2}, . . . , {xm, ym} form designs. A design which needs to be evaluated using this estimation model should also be represented in the normalized RIR image format. By leveraging this concept, additional application are described below.

The below outlined applications include both already implemented and currently being developed solutions. Some of the application are completely tested on-site including finding relevant RTL testcases from regression test suites, clustering RTL testcases, fast violation clustering in VC SpyGlass® Machine Learning Root Cause Analysis (MLRCA), etc. and now these are being used by R&D and Validation Engineers. Others are under development or in the planning phase.

Pre-Lint Solution and Hardware Security. RIR images can be used for automatic and quick violation generation for RTL code before going through expensive checkers using EDA tools. This will be a first level linting check. By this the RTL designer will be highlighted with minor and easy-to-debug miscoding for which an extensive Lint run may not require. Basic checking of Pre-Lint will be on sanity, naming and scope-based bad practices. Upon completion of this step, user can go for an exhaustive Lint run which will ensure a noise free rule violation view. Another advantage in pre-lint solution is that, one can efficiently find specific constructs or construct patterns according to a users' interest. For example, a user might want to identify non-synthesizable constructs present in the RTL code aiming to avoid issues at the synthesis stage.

Hardware Security focuses on the threats a chip design may face at its hardware level. RIR Images can be used to identify any weaker points that may exists in the RTL code. And this can be used in extracting information from the RTL to provide a vulnerability score for the design. Current focused areas are on vulnerability analysis and watermarking.

Figure 7:
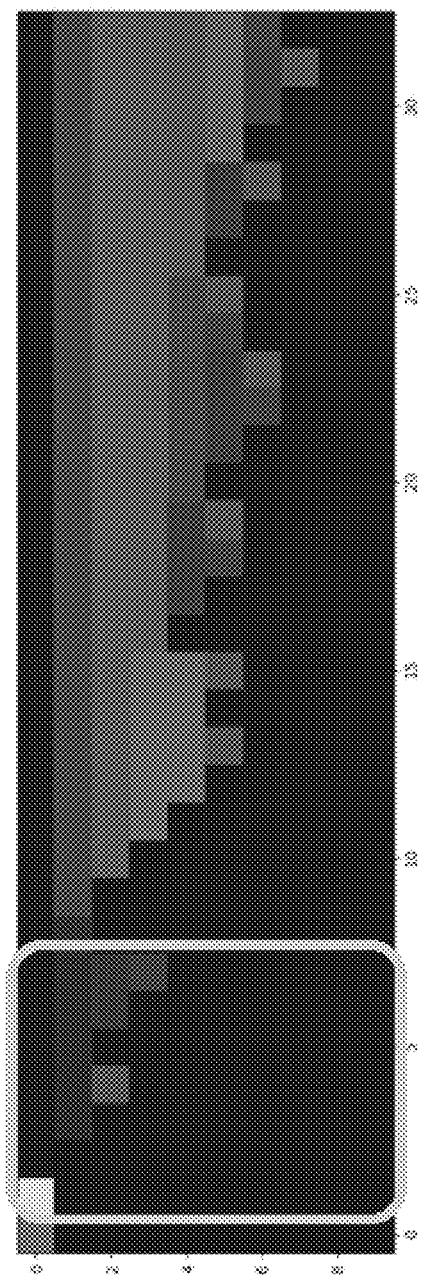
FIG. 7 illustrates type-1 code clone detection using the first through fifth RIR images of FIGS. 3A, 3B, 3C, 3D and 3E according to an embodiment of the technology disclosed.

RTL Code Clone Detection—RTL Code Reusability. FIG. 1 illustrates a type-1 comparison using the RIR images 106. Note that for the type-1 comparison, normalization and generation of the base RTL map is not necessary. Further, FIG. 7 illustrates type-1 code clone detection using the first through fifth RIR images of FIGS. 3A, 3B, 3C, 3D and 3E according to an embodiment of the technology disclosed.

Designers often need to write RTL codes from scratch or search similar usage going through the code. This can be sometimes painful if the designers to go through large number of RTL files. Hence, sometimes designers opt to write the RTL code or codes on their own. The RIR imaging techniques can be used to extract similar occurrences in their design database. Reusing already validated RTL codes often results in saving time and increased quality in new designs.

Suppose that a designer wants to check and see if the RTL code represented by the fourth RIR image (e.g., the fourth RIR image illustrated in FIG. 3D) is present in any other design. As illustrated in FIG. 7, a portion of the RIR image included in FIG. 7 includes the fourth RIR image illustrated in FIG. 3D. Therefore, the RTL code that corresponds to the fourth RIR image has already been used in a different design and has been validated. Accordingly, the designer can safely use the RTL code that corresponds to the fourth RIR image, as well as use a portion of the RTL code that corresponds to the RIR image illustrated in FIG. 7.

This example shows type-2 matching detection (type-2 (and type-1) comparison 120 of FIG. 1) as superficial differences such as identifiers, similar types are not considered. These comparisons can be done by comparing a currently generated RIR image to other RIR images from a repository of RIR images. Implementing the same concept on a normalized image provides type-3 matching detection as different construct patterns are normalized in this format. Hence type-3 and type-4 matching detection (type-3 and type-4 matching detection 122 of FIG. 1) are possibly by leveraging machine learning techniques.

Figure 8:
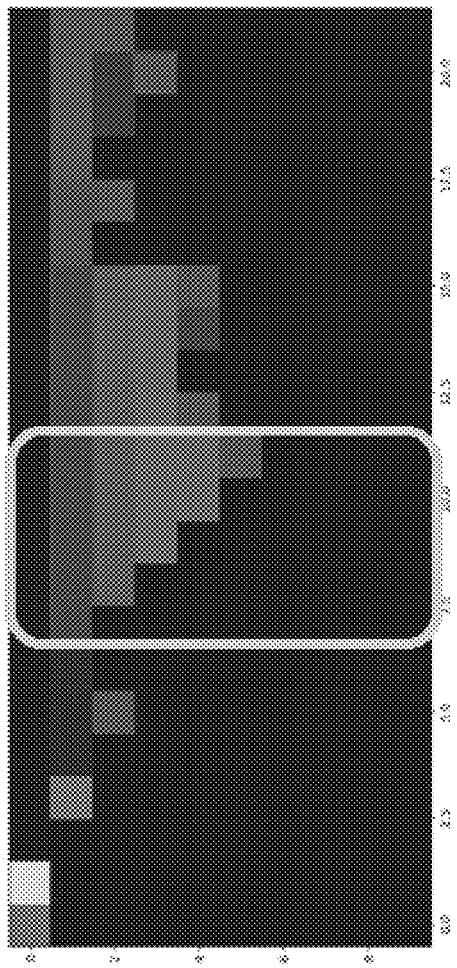
FIG. 8 illustrates a user extracting a related test case when a user inputs a specific pattern according to an embodiment of the technology disclosed.

RTL Code Clone Detection—Find Relevant Test Cases. FIG. 8 illustrates a user extracting a related test case when a user inputs a specific pattern according to an embodiment of the technology disclosed, and FIG. 9 illustrates a user providing specific constructs and identifying RTL code according to the provided constructs.

Developers often spend time on searching for related testcases when developing a solution. This is to increase the test coverage. Failing to do so can result in low test coverage and can cause unexpected results at corner conditions. Further, verification engineers need related or similar test cases for validation of developed solutions and field teams also need related test cases to analyze customer requests. This defines the importance of EDA software that can find similar testcases at different levels.

RIR images can be used to extract set of related test cases when user inputs a specific pattern. This is a very easy way to navigate and construct test cases. Using this a user can specify RTL constructs in the order of scopes and get a matching test case. This saves time of finding related testcases than constructing by their own.

For an example, referring to FIG. 8, if a user specifies "module, always, event, event control, posedge, named object use", the third RIR image of FIG. 3C and the corresponding RTL code, which contains the pattern in FIG. 8, will be recognized.

As discussed above with reference to FIGS. 1 and 6, all unit testcases (RTL constructs of RTL code, or just RTL designs) are converted to RIR vectors. These RIR vectors are assigned with the respective testcase paths (e.g., yi). An intuitive command line interface, as shown in FIG. 9, can be provided to explore through available testcases to find out relevant testcases. When a user needs a testcase which contains specific construct pattern, user may insert the pattern as given in the instructions.

For example, suppose a user needs all the usages of a 'concat' construct, the user could input "concat" as illustrated in FIG. 9. This technique can be used to extract some interesting cases like, 'port, bitselect', 'function, struct', 'udp', 'floatnumber', etc. 'function, struct' will provide us testcases with struct used inside functions where 'port, bitselect' will produce testcases like below.

```
parameter word = 32;
module m(input in, clk, output k[word]);
...
endmodule
```

Figure 10:
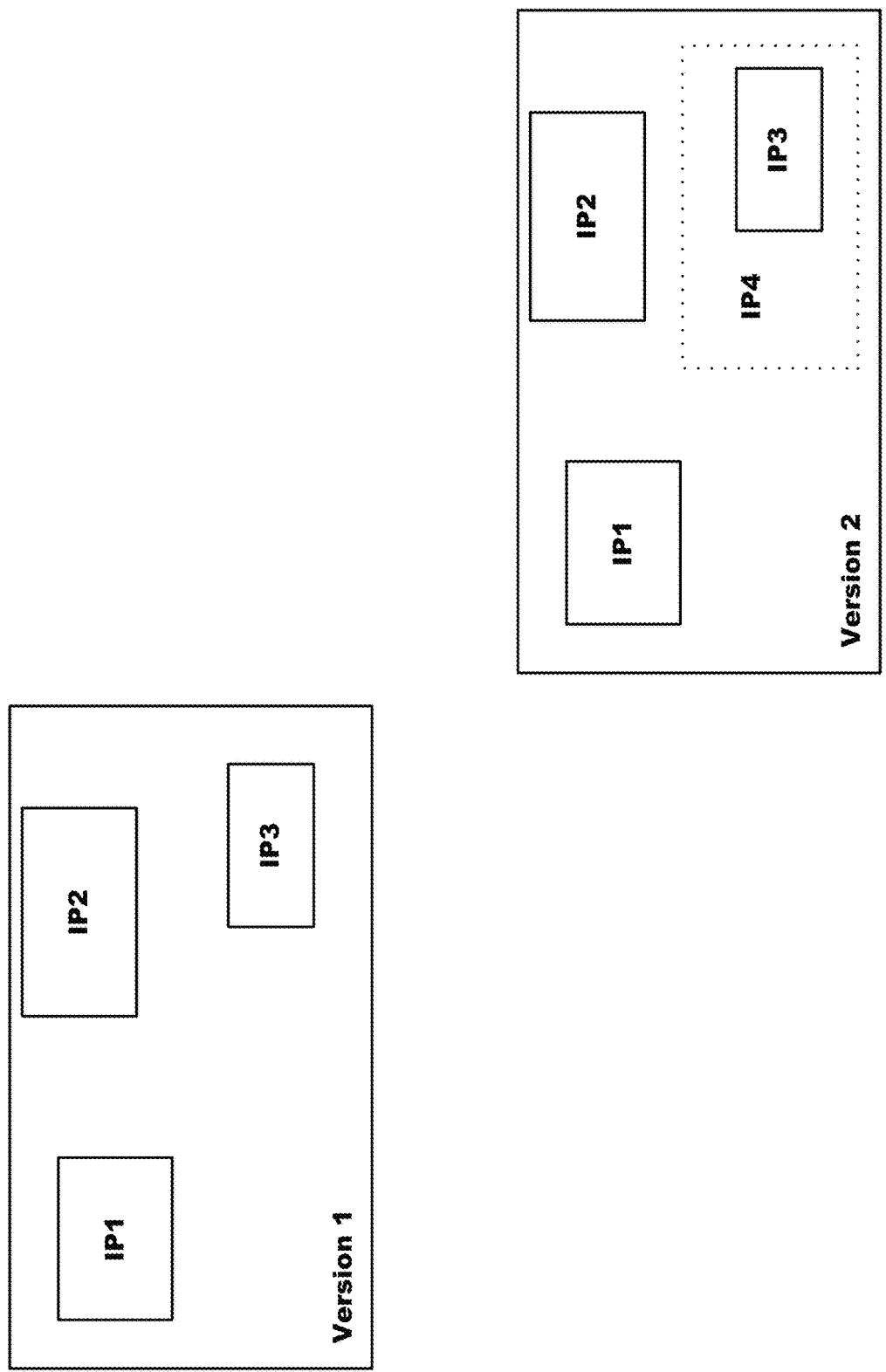
FIG. 10 illustrates using RTL code clone detection to identify which portions of RTL code need to be verified or validated for a second version of a chip, where the first version of the chip has been validated according to an embodiment of the technology disclosed.

RTL Code Clone Detection—Applying Setting on Similar IPs and Code Blocks. FIG. 10 illustrates using RTL code clone detection to identify which portions of RTL code need to be verified or validated for a second version of a chip, where the first version of the chip has been validated according to an embodiment of the technology disclosed.

Specifically, different versions of chips can have similar IPs re-used even at different hierarchical levels. Identifying them would be beneficial as settings (constraints, UPF, project or tcl settings, etc.) applied on IPs on version 1 can be readily applied on the identified IPs on version 2.

As can be seen in FIG. 10, RIR images can be used to identify that IP1, IP2 have been re-used in version 2 of the chip design. Further, IP3 at one hierarchy below can also be identified as being re-used using RIR images.

Hence the settings applied on IP1, IP2 and IP3 in version 1 can be directly applied in version 2 without needing to invest a high effort.

Similarly, RIR images can be used to detect similar RTL structures. By this, an assertion inserted in places can be first recorded and these assertions can be applied on other similar places found using RIR images.

RTL Code Restructuring and Refactoring. FIGS. 11A, 11B and 11C illustrate identifying identical RTL codes from two different code blocks being used in different contexts according to an embodiment of the technology disclosed. Specifically, FIG. 11A illustrates similar RTL codes from two different RTL code blocks according to an embodiment of the technology disclosed, FIG. 11B illustrates first and second RIR images generated from the two different RTL code blocks illustrated in FIG. 11A according to an embodiment of the technology disclosed and FIG. 11C illustrates a normalized image of both of the first and second RIR images illustrated in FIG. 11B according to an embodiment of the technology disclosed.

RIR images can be used for RTL restructuring and refactoring to prepare RTL to optimize the design better. Restructuring parallel blocks of RTL codes provides the same functionality without affecting the external behaviors. This intuition is similarly applicable in RIR concept and is shown in FIGS. 11A, 11B and 11C. Specifically, FIG. 11A illustrates two RTL codes, where different blocks are shuffled without affecting end results. Corresponding RIR images are also illustrated in FIG. 11B. FIG. 11C illustrates an RIR images that is the normalized version of both RIR images of FIG. 11B.

In the RTL codes illustrated in FIG. 11A, the always block, the initial block and the function block are shuffled. From the corresponding RIR images and the normalized RIR images, it is evident that though RTL blocks are shuffled, eventual normalized images are same.

Accordingly, identification of restructured code blocks that do not affect the behavior of RTL code is possible using RIR images. Just as described above, first, the base RTL map is generated using the available RIR images; and second, the RTL code fragments are position according to the order in the base RTL map. In this step, some contiguous RTL vectors of each block can be preserved depending on the user preference.

Machine Learning Usages—RTL Code Clustering. Electronic Design Automation (EDA) tools development is mostly dependent on well-defined RTL test suites to test against the newly introduced modification and bug fixes. If the impact of the changes is high, it is likely there can be multiple RTL testcase failures. It can sometimes range up to thousands of RTL testcases. And the developer is required to go through these failures to validate their changes. However, out of this many RTL testcases, there can be only few distinct testcases which should be analyzed differently. In other words, these testcases can be bucketized so that only one of the testcases from each bucket can be analyzed in order to reduce the time on redundant analysis on other testcases from same bucket.

Benefits can be achieved from RIR vector representation as the technology disclosed implements unsupervised machine learning techniques to cluster similar testcases together. Hence RTL testcase clustering can be used to reduce the time spent on analyzing failed testcases while maintaining analysis coverage at the same level.

Another aspect of EDA tool validation is that developers normally run large benchmark designs to see any performance impact and the impact in rule checks. Consider a large set of benchmark designs, converging with the results can take several hours or days sometimes. However, if the benchmark designs are carefully analyzed, there can be closely related designs with minor tweaks. Redundant designs can be excluded and only one (non-redundant) design can be retained, as it will not make much harm in the performance and violation analysis.

Unsupervised clustering techniques can be used to cluster similar designs and pick only one design from each cluster to avoid similar designs being run. Further, a computing correlation matrix can be used to analyze how similar benchmark designs are and to improve turn-around-time in benchmark design runs.

Machine Learning Usages—Design Component Recognition. IP designs include well-defined set of RTL components. Some of these design components can even be reused for other IP designs. For an example, FIFO component can be used with range of IPs.

Generally, FIFO components include memory or array to save different state outputs, always blocks and sensitivity list, blocking assignments inside always blocks and conditional blocks for different states. Hence it is possible to train a model with RIR of different design components and recognize a FIFO block.

In-house benchmark design suite can even have 40000+ design parts. While going through the design parts, it should be evident that there are some well-known design components can be found such as memory, FIFO, read interface, write interface, counter, encoder, decoder, etc.

Supervised machine learning techniques can be used to train design components. Neural Network model trained with a set of design components could predict a FIFO component with 0.9826 accuracy.

Further, similar design components can be clustered into similar buckets and going even further, design components can be proposed to the designers who needs them.

Machine Learning Usages—Relationship of Rule Checks. EDA tools can flag multiple rule violations on the same RTL design object. VC SpyGlass® Lint tool approximately has 1500 rule checks. As described, some of the violations coming from different rule checks can be related as the fix for them should be the same. There are regression RTL testcases that can run all the rule checks and see how probable two rules can be flagged on the same RTL object. This learning can be used in determining the relationship between each rule.

Supervised machine learning techniques can be used where RIR images are generated for each regression RTL testcase and label them with violation flagged rule tags. This learning can be used to analyze rule violation relationships to avoid uncorrelated rule pairs from the analysis Auto RCA to Violation Grouping in VC Lint ML RCA. Machine Learning based Root Cause Analysis (ML RCA) can be used to cluster violations based on their root causes. This clustering happens in two stages such as RCA clustering and Non-RCA clustering. Non-RCA clustering uses categorical data where the pre-clustering distance calculation expected to be very expensive and time consuming.

As described above with respect to RIR Extensions, different forms of RIR vectors can be used for applications which need high precision. Using this RIR extended methodology, RIR based clustering is introduced as an alternative approach to Non-RCA clustering. This provides virtues that are not presented in the Non-RCA clustering, as described below:

(i) Increased coverage than Non-RCA flow.
  (ii) Reduce performance issue with respect to categorical clustering techniques.
  (iii) More higher-level clustering even when violation statements are different.
  (iv) Different constructs are resulted in different clusters, even though they look similar.
  (v) Infer more meaningful RCA or rationale for currently undiscovered rules and scenarios.
  (vi) Automatic waiver applications.

Noise reduction Using Naïve Bayes Approach. Naïve Bayes approach is a straightforward application of using RIR images. Specifically, RTL vectorization can provide probabilistic benefits as well as machine learning capabilities. For example, EDA tools (such as SpyGlass®) generally include Lint rule checks. Each rule is responsible to catch specific type of RTL miscoding RTL codes. If such miscoding found, the user will be notified via violations warnings from related rules. Refer to the example below:

```
module top(input in, output out);
    sub inst(in, ,out); // ← (B)
endmodule
module sub(input in1, in2, output out);
    assign out = in1 & in2;
endmodule
```

There is a terminal left without assigning in (B). This would give us below violations in Table C from respective rules in Lint.

TABLE C

| Rule | Line | Violation Message |
| --- | --- | --- |
| FloatingInputs | 6 | Input pin in2 on comb-and gate (master RTL_AND) corresponding to net top.out is undriven(connected to top.inst.in2) |
| PartConnPort-ML | 2 | Port 'in2' is unconnected or partially connected in instance 'inst' [Hierarchy: ':top'] |
| UndrivenInTerm-ML | 2 | Detected undriven input terminal top.inst.in2 |
| W287a | 2 | Input 'in2' of instance 'inst' is unconnected [Hierarchy: ':top'] |
| checkIOPinConnectedToNet | 6 | Input top.inst.rtcl_I2.in2 for instance top.inst.rtlc_I2(CellRTL_AND) is unconnected |
| checkNetDriver | 6 | Signal top.inst.in2 does not have any driver |

However, fixing (B) by inserting a proper terminal would resolve and eliminate the above 6 violations. This means the fix of one place resolves 6 violations.

There are around ~1500 rules in SpyGlass® Lint. Hence it is expected that there can be huge number of violation warnings from these rules for a large design. However, there would only be less places which are responsible for these violations. As an example, fixing 100 places in RTL would resolve 10 k violations. This application focuses on extracting these root cause places in the RTL code to resolve thousands of violations.

This can be done by clustering violation warnings based on the customer design. Suppose as per the above example, the violations are V1, V2, V3, V4, V5, and V6. In general, a relationship between Vi and Vj ($1 \leq i \leq 6$, $1 \leq j \leq 6$ while i is not equal to j) is identified. The relationship is predicted using generated RTL design data.

Assume that, in a user design, one needs to decide whether V1 and V2 are related. This can be done using a data vector for the design snippet containing both the V1 and V2 from the user design.

$$X_{RTLD} = [X_1, X_2, \ldots X_n]^T$$

Hence, the probability of an event E can be represented as:

$$P(E \mid X_{RTLD}) = P(E \mid X_1, X_2, \ldots X_n) = \frac{\prod_{i=1}^{n} P(xi \mid E) * P(E)}{P(x1, x2, \ldots, xn)}$$

$$P(E \mid X_{RTLD}) \propto \prod_{i=1}^{n} P(xi \mid E) \times P(E)$$

Based on Naïve Bayes Theorem, only the data vectors associated with V1 and V2 can be considered. Which means non-existent xi can be left out. Therefore, the equation becomes:

$$P(E \mid X_{RTLD}) \propto \Pi_{i=1, xi \neq 0}^{n} P(xi \mid E) \times P(E)$$

Accordingly, the entire picture from the user design is not necessary. Using only these few data vectors, one can still calculate the likelihood of V1 and V2 being related $P(E=1 \mid X_{RTLD})$ or not related $P(E=0 \mid X_{RTLD})$. Then, based on both the above probabilities, the technology disclosed can decide whether there exists a relationship between V1 and V2.

$E = \text{argmax}_E \Pi_{i=1}^{n} P(xi \mid E) \times P(E)$

These probability calculations need pre-computed tables of each feature given the event (E) occurred. This can be calculated at once using RIR vectors of all the unit RTL testcases. Aggregation of these vectors can be stated as RIR Matrix shown in Table D below.

TABLE D

| $X^{(i)}$ | $X_1$ | $X_2$ | ... | $X_9$ | ... | $X_n$ |
|---|---|---|---|---|---|---|
| $X^{(1)}$ | 0 | 1 | ... | 0 | ... | 1 |
| $X^{(2)}$ | 1 | 0 | ... | 0 | ... | 1 |
| ... | ... | ... | ... | ... | ... | ... |
| $X^{(8)}$ | 0 | 0 | ... | 1 | ... | 1 |
| ... | ... | ... | ... | ... | ... | ... |
| $X^{(m)}$ | 1 | 1 | ... | 0 | ... | 0 |

Figure 12:
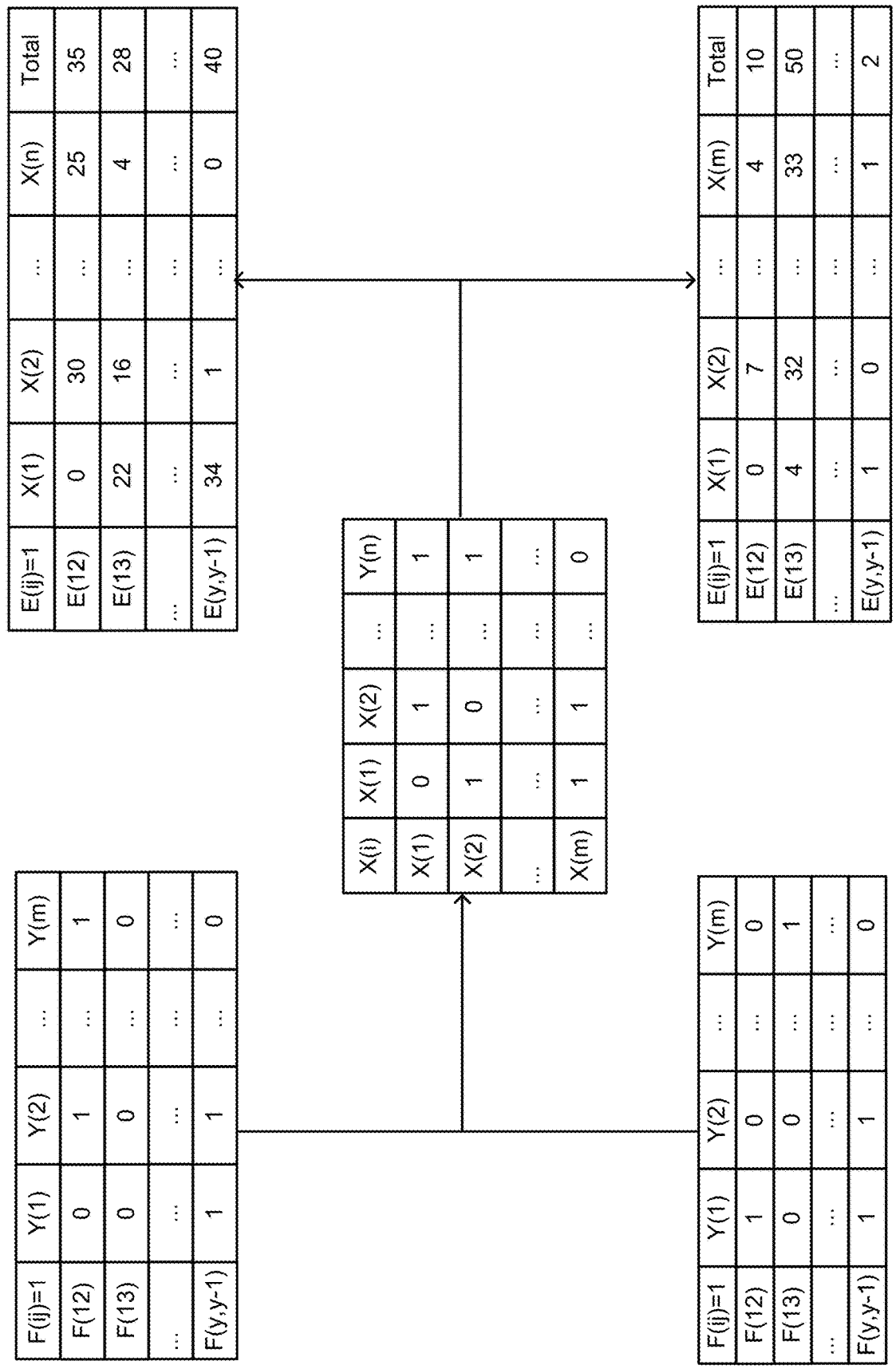
FIG. 12 illustrates how an RIR matrix can be used to generate pre-computed tables according to an embodiment of the technology disclosed.

FIG. 12 illustrates how an RIR matrix can be used to generate pre-computed tables according to an embodiment of the technology disclosed. The example above only involves a V1 and V2 relationship computation. This can be named as E(1,2). Generally, there is a need to calculate values for E(i,j) where $0 < i, j < |V|$, $i \neq j$ and V denotes the violations. Accordingly, approximately $|V| \times |V|$ number of pre-computed tables is needed. However, when decomposing all the pre-computed tables, the RIR matrix can be found as the common factor of all the events, which is illustrated in FIG. 12. Here, each F(i,j) vector represents whether i and j are flagged together in y(k) testcase. Each E(i,j) vector represents the construct features (xi) presence when i and j are both flagged and this can be used to calculate the probability of i and j being flagged together.

Figure 13:
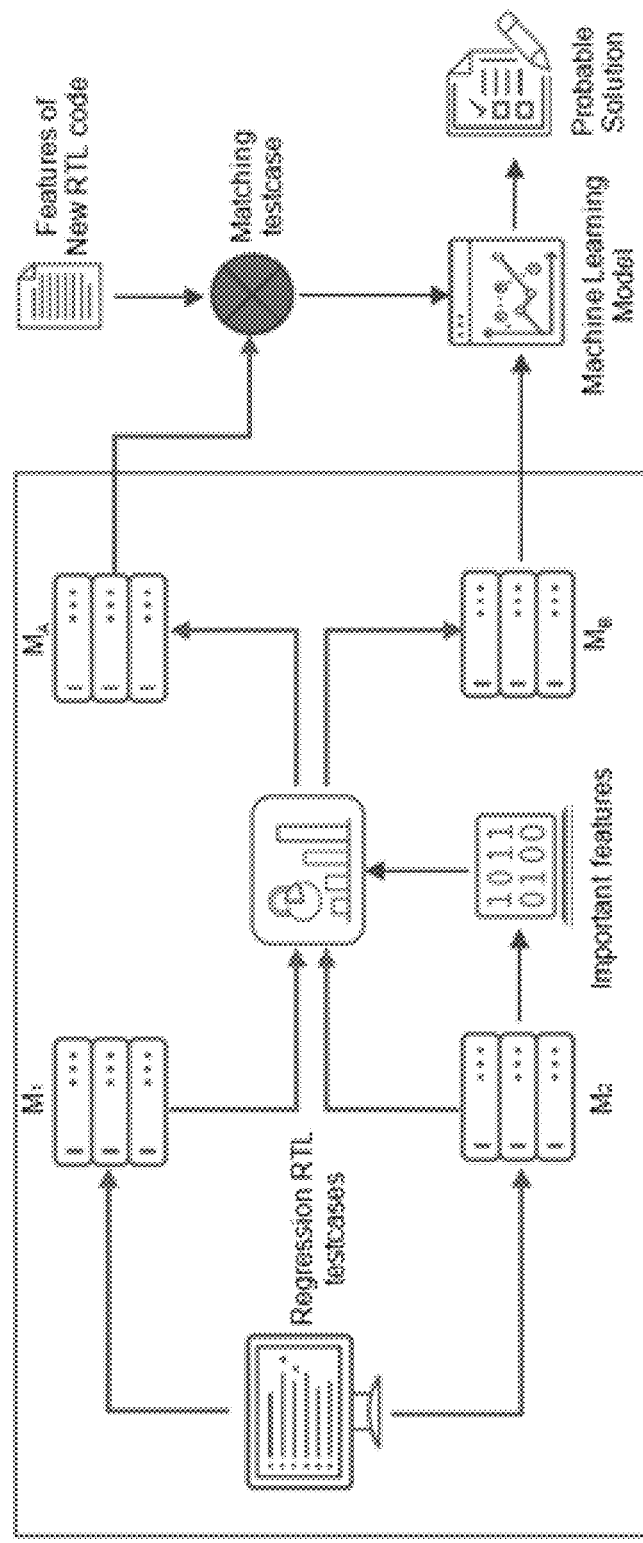
FIG. 13 illustrates a flowchart for automatic violation correction.

Automatic Violation Correction (AVC). EDA tools such as VC SpyGlass Lint provide users with possible violations found in their design against pre-defined set of design conventions. It is the users' responsibility to take corrective actions to get rid of these violations such as correcting the RTL code or waiving the violations. However, correcting a design violation requires a reasonable consideration and hence involves with a learning curve. FIG. 13 illustrates a flowchart for automatic violation correction.

RIR methodology can be used to extract design information from regression RTL testcases with respect to rule violations (i.e., the testcases can be divided up as a particular violation occurred (positive cases) and not occurred (negative cases) and can be used to train a machine learning model to suggest possible fixes to resolve each violation). Accordingly, a methodology to automatically suggest how a violation can be corrected is described.

This requires proper location of where the violation can occur in the RTL testcases. However, since the concern about the objects is where violations occur in the regression RTL testcases, there can be few issues as follows, First, there can be number of violations from different rules at the same point where RIR pattern is similar such as violations of a few different rules reported at port/net declarations. This causes differentiating violations of different rules very hard. Second, pointed RTL object by the violation, and the real issue happened are at different places. For an example, violations occur at gates in instantiated sub modules whereas the issue could have occurred at the instantiations. Third, the same rule can have different violation construct patterns (i.e. violation at different constructs). For example, a rule may report violations inside generate blocks, functions, etc.

To address these issues, a mechanism is needed to get the correct place where violations occur irrespective of the place where violation points. This can be done using unit regression testcases as below.

First, all the testcases are divided as '$M_1$' and '$M_2$' as violations (say from Rule1) flagged unit testcases and not flagged unit testcases. Say the number of testcases Rule1 has been flagged is '$m_1$' ('$|M_1|$') and the number of testcases Rule1 has not been flagged is '$m_2$' ('$|M_2|$') where total number of testcases will be, $m = m_1 + m_2$. Then, all the testcases on which Rule1 violations occurred ($M_1$) are identified and then RIR vectors are generated corresponding to each testcase. Now add up all the features together (vertical aggregation), as illustrated in the table below.

| TC1 | 1 | 0 | 0 | ... | 1 |
|---|---|---|---|---|---|
| TC2 | 0 | 1 | 0 | ... | 0 |
| ... | ... | ... | ... | ... | ... |
| TCm | 0 | 0 | 1 | ... | 1 |
| Total | 2 | 4 | 10 | ... | 3 |

Then apply a benchmark (70% of the highest value) and get only the most important features. The most important feature for Rule1 might be at the $3^{rd}$ index. This can be checked to see if it is present in any testcase of $M_1$ where if not present, exclude that from $M_1$ and create $M_A$. This can also be checked to see if this is present in any testcase of $M_2$ where if not present, exclude that from $M_2$ and create $M_B$.

To address the above-describe third issue, a few important features corresponding to different violations are tracked.

Then, each testcase from $M_A$ and $M_B$ can be used to construct the RIR vector table. This can be used to train a supervised machine learning model where it can predict possible fixes for each violation. A flowchart for AVC is illustrated in FIG. 13

Dynamic Rule Selection (DRS). EDA tool users (such as VC SpyGlass Lint tool users) run number of rule checks on their RTL and netlist designs to enable early sign-off of their designs. This is by running a pre-defined set of rules which is called methodology. However, there can be rule checks which by no means relevant to their designs. For an example, there can be rules to check on package files, but the current design might not at all use packages. If user identify and disable these irrelevant rules, this will lead in improving runtime and memory efficiency.

A user might be unaware that there are rules which are relevant to the current designs, but the user has not included them in the current methodology. If a user identifies and enables these relevant rules, it will lead to discovering hidden bugs in early design cycles thereby improving the quality. Some designs are frequently modified. In this case, rules what they have adapted would be different on the circumstance. Hence need a fast rule selection mechanism independent from early adaption.

All these issues highlight the need of a dynamic rule selection mechanism. Using extended RIR methodology, a smart tool can be implemented that can identify the optimum rule set in EDA tools pertaining to a design even without going through the documentation.

The technology disclosed can use Supervised Neural Network learning technique where it uses regression violation information to train the model. Prediction accuracy is ~90% in most of the benchmark designs. Higher false positives may be observed for these designs. This is expected, as the technology disclosed focuses on reducing the false negatives as much as possible. And while keeping the false negatives low, false positives could be reduced by increasing the feature set as described under extended RIR methodology.

Additional Results

Constructs data of RTL designs are extracted from SpyGlass® tool. Transforming these to RIR images can be done using a Python script. The code detection is also implemented in Python to consume RIR data and to identify similar code blocks. RIR provides support for type-1 and type-2 matching without normalization. It is required to have the code fragment to be searched for and also converted to RIR format to use a sliding window to find the code fragment it is contained in non-normalized images. Normalized RIR view supports both type-3 and type-4 matchings, while these types exploit machine learning techniques to provide partial matching. Though it is not explicit, there is room for type-4 matching using RIR extension described above.

RIR images can be used to extract RTL unit testcases from unit testcase (regression) area based on user inputs. Generally, the developers or validation engineers manually go through each RTL testcases to see a matching testcase. If not found, they construct testcases on their own. This is very time consuming. On the other hand, using RIR images gives the user to the ability to extract RTL testcases and modify to match their requirement efficiently.

RIR image generation gives us a linear running time where it is proportional to the number of lines in the source code. The Type-1 and Type-2 matching detections are also linear while Type-3 can depend on the machine learning techniques.

Additional Comments

Figure 14A:
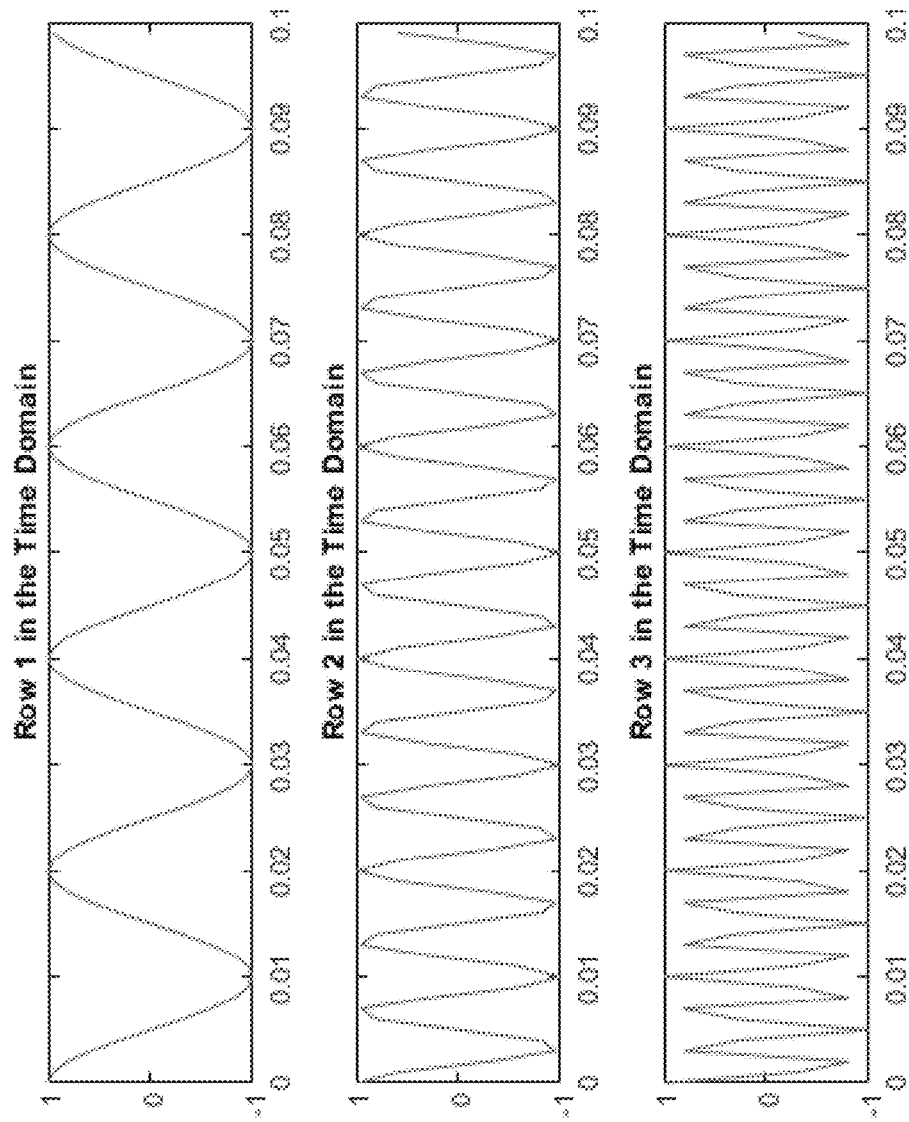
FIG. 14A illustrates a signal spectrum analysis in a signal processing time domain according to an embodiment of the technology disclosed.
Figure 14B:
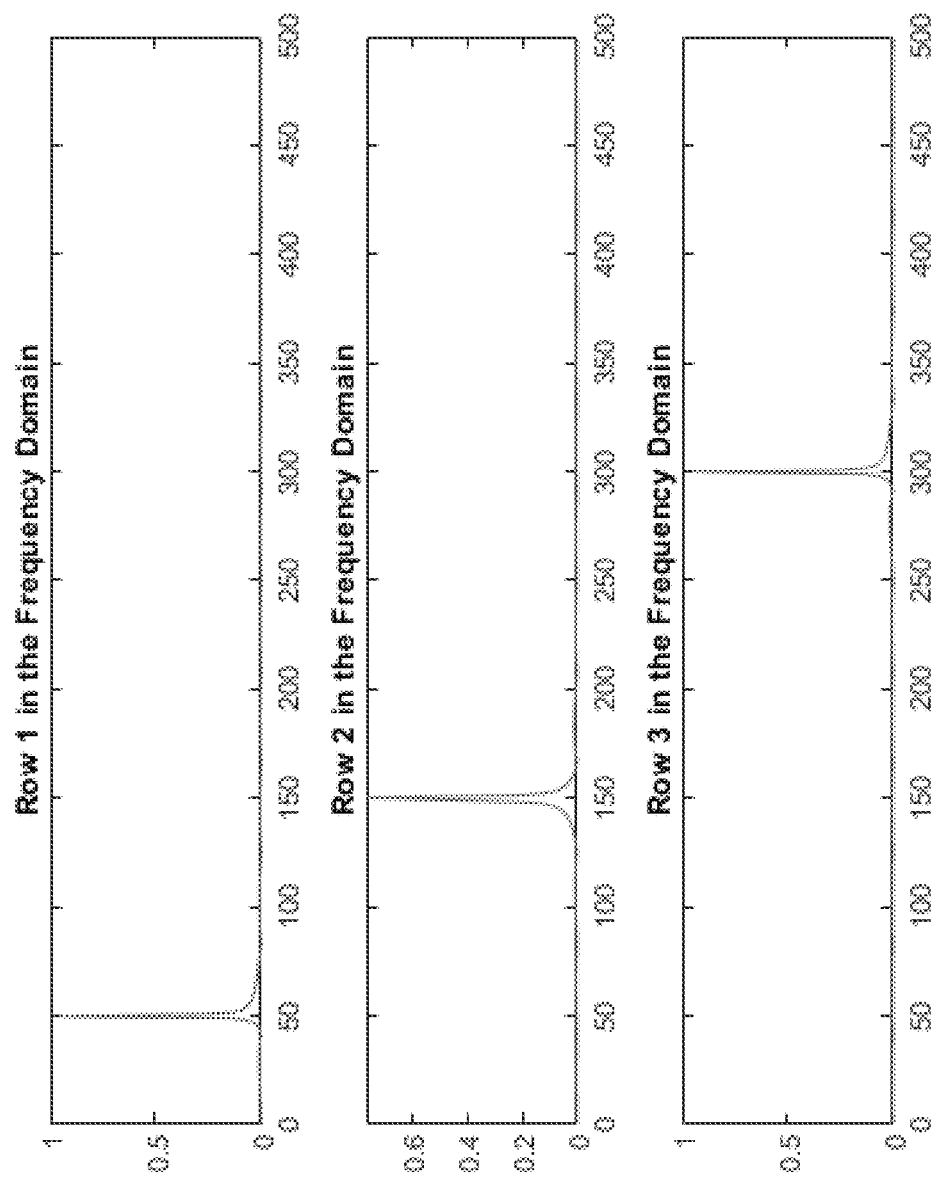
FIG. 14B illustrates a signal spectrum analysis in a signal processing frequency domain according to an embodiment of the technology disclosed.

FIG. 14A illustrates a signal spectrum analysis in a signal processing time domain according to an embodiment of the technology disclosed and FIG. 14B illustrates a signal spectrum analysis in a signal processing frequency domain according to an embodiment of the technology disclosed. FIGS. 14A and 14B provide an analogy/comparison between the RIR methodology and signal spectrum analysis.

This RIR methodology is based on abstraction of RTL constructs or types, mainly because of the varying nature of RTL code length between RTL designs. While maintaining the same infrastructure, this technique can be applied to a number of areas as explored under 'APPLICATIONS OF RIR IMAGE GENERATION' section of this document.

Automatic waiver and power generation are also possible. Using an EDA tool, the same concept can be extended to other settings such as Unified Power Format (UPF), SDC constraints, etc.

Physical RTL Optimization is also possible where the focus is on eliminating RTL coding constructs that may cause problems in physical design space. Detection of these problematic coding constructs at RTL level and replacing or modifying needs a robust technique. RIR with extended machine learning interface is a possible solution for this.

Figure 15:
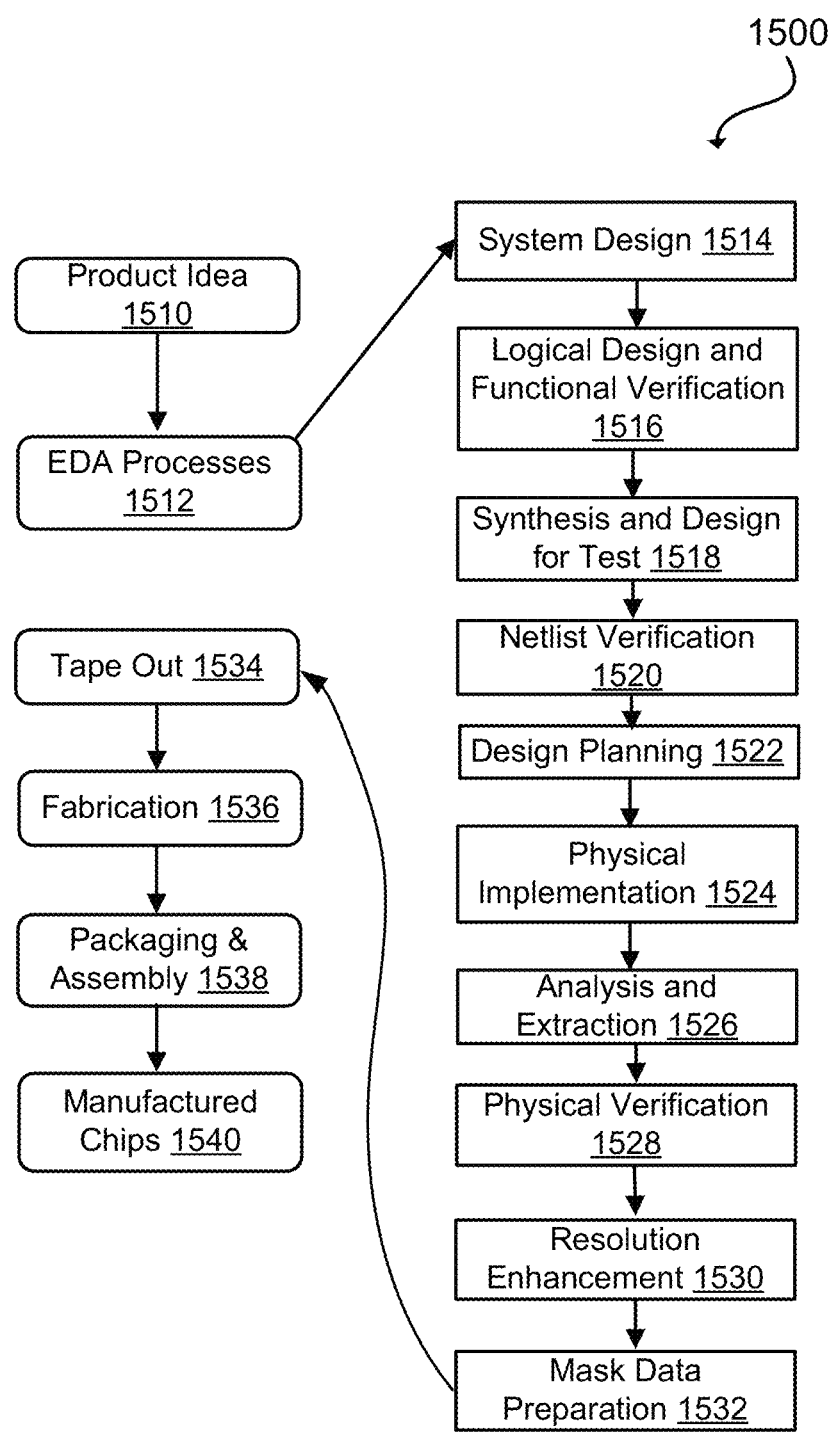
FIG. 15 depicts a flowchart of various processes used during the design and manufacture of an integrated circuit in accordance with some embodiments of the present disclosure.

FIG. 15 illustrates an example set of processes 1500 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1510 with information supplied by a designer, information which is transformed to create an article of manufacture that uses a set of EDA processes 1512. When the design is finalized, the design is taped-out 1534, which is when artwork (e.g., geometric patterns) for the integrated circuit is sent to a fabrication facility to manufacture the mask set, which is then used to manufacture the integrated circuit. After tape-out, a semiconductor die is fabricated 1536 and packaging and assembly processes 1538 are performed to produce the finished integrated circuit 1540.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 15. The processes described by be enabled by EDA products (or tools).

During system design 1514, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1516, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1518, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1520, the netlist is checked for compliance with timing constraints and for correspondence with the HDL code. During design planning 1522, an overall floor plan for the integrated circuit is constructed and analyzed for timing and top-level routing.

During layout or physical implementation 1524, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1526, the circuit function is verified at the layout level, which permits refinement of the layout design. During physical verification 1528, the layout design is checked to ensure that manufacturing constraints are correct, such as DRC constraints, electrical constraints, lithographic constraints, and that circuitry function matches the HDL design specification. During resolution enhancement 1530, the geometry of the layout is transformed to improve how the circuit design is manufactured.

During tape-out, data is created to be used (after lithographic enhancements are applied if appropriate) for production of lithography masks. During mask data preparation 1532, the 'tape-out' data is used to produce lithography masks that are used to produce finished integrated circuits.

A storage subsystem of a computer system (such as computer system 1600 of FIG. 16, or host system 1507 of FIG. 15) may be used to store the programs and data structures that are used by some or all of the EDA products described herein, and products used for development of cells for the library and for physical and logical design that use the library.

Figure 16:
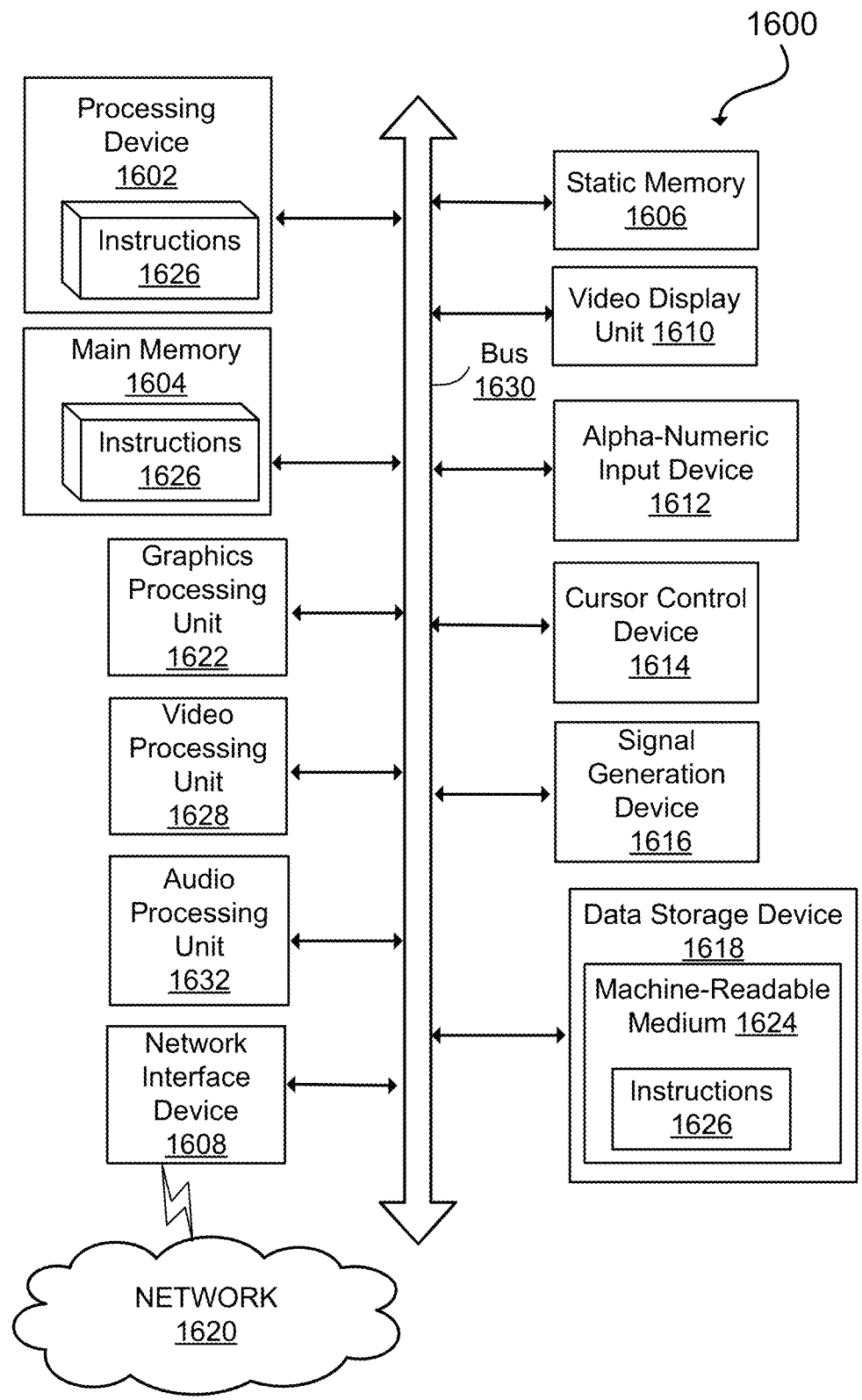
FIG. 16 depicts an abstract diagram of an example computer system in which embodiments of the present disclosure may operate.

FIG. 16 illustrates an example machine of a computer system 1600 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1600 includes a processing device 1602, a main memory 1604 (e.g., read-only memory (ROM), flash memory, dynamic random access memory (DRAM) such as synchronous DRAM (SDRAM), a static memory 1606 (e.g., flash memory, static random access memory (SRAM), etc.), and a data storage device 1618, which communicate with each other via a bus 1630.

Processing device 1602 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1602 may also be one or more special-purpose processing devices such as an application specific integrated circuit (ASIC), a field programmable gate array (FPGA), a digital signal processor (DSP), network processor, or the like. The processing device 1602 may be configured to execute instructions 1626 for performing the operations and steps described herein.

The computer system 1600 may further include a network interface device 1608 to communicate over the network 1620. The computer system 1600 also may include a video display unit 1610 (e.g., a liquid crystal display (LCD) or a cathode ray tube (CRT)), an alphanumeric input device 1612 (e.g., a keyboard), a cursor control device 1614 (e.g., a mouse), a graphics processing unit 1622, a signal generation device 1616 (e.g., a speaker), graphics processing unit 1622, video processing unit 1628, and audio processing unit 1632.

The data storage device 1618 may include a machine-readable storage medium 1624 (also known as a non-transitory computer-readable medium) on which is stored one or more sets of instructions 1626 or software embodying any one or more of the methodologies or functions described herein. The instructions 1626 may also reside, completely or at least partially, within the main memory 1604 and/or within the processing device 1602 during execution thereof by the computer system 1600, the main memory 1604 and the processing device 1602 also constituting machine-readable storage media.

In some implementations, the instructions 1626 include instructions to implement functionality corresponding to the present disclosure. While the machine-readable storage medium 1624 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1602 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method of generating images from Register Transfer Level (RTL) code for clone detection or code verification, the method comprising:
   obtaining a first RTL code;
   extracting first RTL constructs from the first RTL code;
   identifying a first object path of interest from the first RTL constructs;
   generating a first array from the extracted first RTL constructs by populating the first array with (i) identified first indexes associated with the first RTL constructions and (ii) values assigned to the first indexes in dependence on corresponding depths of the first RTL construction in the first object path of interest, such that there is a particular value assigned to each identified index;
   generating a first RTL image recognition (RIR) image from the generated first array, wherein color in the first RIR image corresponds to the values included in the first array;
   comparing the generated first RIR image to other RIR images to find a portion of an RIR image that matches at least a portion of the generated first RIR image; and
   determining, by a processor, that the portion of the first RIR code is validated as a result of finding the portion of the RIR image that matches the portion of the generated first RIR image.

2. The method of claim 1, further comprising sorting the values in the first array based on non-zero values assigned to the first indexes to obtain a first index array.

3. The method of claim 1, further comprising:
generating a first skeletal view table using the first index array, wherein (i) each row in the first skeletal view table corresponds to a different depth of the first object path of interest, (ii) values of cells in each row of the first skeletal view table correspond to the index or indexes associated with corresponding first RTL constructs implemented at each different depth, where each cell in the first skeletal view table that does not have a value that corresponds to an index of the first indexes is assigned a value of 0; and
transposing the first skeletal view table,
wherein the first RIR image is generated from the transposed first skeletal view table, where each value in the first skeletal view table represents a color in each corresponding pixel in the first RIR image.

4. The method of claim 3, wherein duplicate columns within the transposed first skeletal view table are discarded before the first RIR image is generated from the transposed first skeletal view table.

5. The method of claim 3, wherein the first skeletal view table is of m-by-n dimensions, where m is an integer that defines a number of rows and m is equal to a number of different depth patterns identified in the first object path of interest, and where n is an integer that defines a number of columns.

6. The method of claim 5, wherein n is predefined by user input RTL code.

7. The method of claim 3, further comprising generating a base RTL map by aggregating the first RIR image and a second RIR image generated using an obtained second RTL code.

8. The method of claim 7, wherein duplicate columns between the first and second RIR images are excluded from being included in the base RTL map.

9. The method of claim 7, further comprising:
respectively normalizing the base RTL map against the first and second RIR images by identifying columns from the base RTL map that match the respective first and second RIR image, to generate first and second normalized RIR images; and
performing a type-3 or a type-4 comparison between the first and second normalized RIR images and the other RIR images to identify cloned or verified RTL codes.

10. The method of claim 9, further comprising:
generating a first canonical RIR vector for the first normalized RIR image by comparing each column of the transposed first skeletal view table to each column of the base RTL map and assigning a value in a corresponding position in the first canonical RIR vector in dependence on whether a column from the transposed first skeletal view table matches a column of the base RTL map;
generating a second canonical RIR vector for the second normalized RIR image by comparing each column of a transposed second skeletal view table to each column of the base RTL map and assigning a value in a corresponding position in the second canonical RIR vector in dependence on whether a column from the transposed second skeletal view table matches a column of the base RTL map; and
performing the type-3 or type-4 comparison by comparing the first canonical RIR vector and the second canonical RIR vector to other canonical RIR vectors representing the other RIR images.

11. A non-transitory computer readable storage medium comprising stored instructions to generate images from Register Transfer Level (RTL) code for clone detection or code verification, the instructions, which when executed on a processor, cause the processor to perform operations comprising:
obtaining a first RTL code;
extracting first RTL constructs from the first RTL code;
identifying a first object path of interest from the first RTL constructs;
generating a first array from the extracted first RTL constructs by populating the first array with (i) identified first indexes associated with the first RTL constructions and (ii) values assigned to the first indexes in dependence on corresponding depths of the first RTL construction in the first object path of interest, such that there is a particular value assigned to each identified index;
generating a first RTL image recognition (RIR) image from the generated first array, wherein color in the first RIR image corresponds to the values included in the first array;
comparing the generated first RIR image to other RIR images to find a portion of an RIR image that matches at least a portion of the generated first RIR image; and
determining that the portion of the first RIR code is validated as a result of finding the portion of the RIR image that matches the portion of the generated first RIR image.

12. The non-transitory computer readable storage medium of claim 11, wherein the operations further comprise:
generating a first skeletal view table using a first index array, wherein (i) each row in the first skeletal view table corresponds to a different depth of the first object path of interest identified from the first RTL constructs, (ii) values of cells in each row of the first skeletal view table correspond to an index or indexes associated with corresponding first RTL constructs implemented at each different depth, where each cell in the first skeletal view table that does not have a value that corresponds to an index of first indexes is assigned a value of 0, and
transposing the first skeletal view table,
wherein the first RIR image is generated from the transposed first skeletal view table, where each value in the first skeletal view table represents a color in each corresponding pixel in the first RIR image.

13. The non-transitory computer readable storage medium of claim 12, wherein the operations further comprise:
generating a base RTL map by aggregating the first RIR image and a second RIR image generated using an obtained second RTL code.

14. The non-transitory computer readable storage medium of claim 13, wherein duplicate columns between the first and second RIR images are excluded from being included in the base RTL map.

15. The non-transitory computer readable storage medium of claim 13, wherein the operations further comprise:
respectively normalizing the base RTL map against the first and second RIR images by identifying columns from the base RTL map that match the respective first and second RIR image, to generate first and second normalized RIR images; and
performing a type-3 or a type-4 comparison between the first and second normalized RIR images and the other RIR images to identify cloned or verified RTL codes.

16. The non-transitory computer readable storage medium of claim 15, wherein the operations further comprise:
generating a first canonical RIR vector for the first normalized RIR image by comparing each column of the first transposed skeletal view table to each column of the base RTL map and assigning a value in a corresponding position in the first canonical RIR vector in dependence on whether a column from the first transposed skeletal view table matches a column of the base RTL map;

generating a second canonical RIR vector for the second normalized RIR image by comparing each column of a transposed second skeletal view table to each column of the base RTL map and assigning a value in a corresponding position in the second canonical RIR vector in dependence on whether a column from the transposed second skeletal view table matches a column of the base RTL map; and performing the type-3 or type-4 comparison by comparing the first canonical RIR vector and the second canonical RIR vector to other canonical RIR vectors representing the other RIR images.

17. A system comprising:

a memory storing instructions to generate images from Register Transfer Level (RTL) code for clone detection or code verification; and a processor, coupled with the memory and to execute the instructions, the instructions when executed cause the processor to:

obtain a first RTL code;

extract first RTL constructs from the first RTL code;

identify a first object path of interest from the first RTL constructs;

generate a first array from the extracted first RTL constructs by populating the first array with (i) identified first indexes associated with the first RTL constructions and (ii) values assigned to the first indexes in dependence on corresponding depths of the first RTL construction in the first object path of interest, such that there is a particular value assigned to each identified index;

generate a first RTL image recognition (RIR) image from the generated first array, wherein color in the first RIR image corresponds to the values included in the first array;

generate a first normalized RIR image using the first RIR image;

generate a second normalized RIR image using a second RIR image; and compare the generated first and second normalized RIR images to other RIR images to identify cloned or verified RTL codes.

18. The system of claim 17, wherein the comparison of the first and second normalized RIR images to the other RIR images is a type-3 or a type-4 comparison.

19. The system of claim 18, wherein the instructions, when executed, further cause the processor to:

generate a first canonical RIR vector for the first normalized RIR image by comparing each column of a transposed first skeletal view table to each column of a base RTL map and assign a value in a corresponding position in the first canonical RIR vector in dependence on whether a column from the transposed first skeletal view table matches a column of the base RTL map;

generate a second canonical RIR vector for the second normalized RIR image by comparing each column of a transposed second skeletal view table to each column of the base RTL map and assign a value in a corresponding position in the second canonical RIR vector in dependence on whether a column from the transposed second skeletal view table matches a column of the base RTL map; and perform the type-3 or type-4 comparison by comparing the first canonical RIR vector and the second canonical RIR vector to a repository of other canonical RIR vectors representing the other RIR images.

* * * * *